United States Patent
Herner

(10) Patent No.: US 11,444,121 B2
(45) Date of Patent: *Sep. 13, 2022

(54) PIXEL OR DISPLAY WITH SUB PIXELS SELECTED BY ANTIFUSE PROGRAMMING

(71) Applicant: Scott Brad Herner, Portland, OR (US)

(72) Inventor: Scott Brad Herner, Portland, OR (US)

(73) Assignee: Black Peak LLC, Boulder, CO (US)

(*) Notice: Subject to any disclaimer, the term of this patent is extended or adjusted under 35 U.S.C. 154(b) by 114 days.

This patent is subject to a terminal disclaimer.

(21) Appl. No.: 17/160,055

(22) Filed: Jan. 27, 2021

(65) Prior Publication Data

US 2022/0139998 A1  May 5, 2022

Related U.S. Application Data

(63) Continuation of application No. 17/085,088, filed on Oct. 30, 2020, now Pat. No. 11,004,895.

(51) Int. Cl.
| | |
|---|---|
| *H01L 27/15* | (2006.01) |
| *H01L 33/00* | (2010.01) |
| *H01L 33/30* | (2010.01) |
| *H01L 33/32* | (2010.01) |
| *H01L 33/62* | (2010.01) |
| *H01L 21/66* | (2006.01) |
| *H01L 23/525* | (2006.01) |
| *H01L 33/50* | (2010.01) |

(52) U.S. Cl.
CPC .......... *H01L 27/156* (2013.01); *H01L 22/22* (2013.01); *H01L 23/5252* (2013.01); *H01L 33/0095* (2013.01); *H01L 33/30* (2013.01); *H01L 33/32* (2013.01); *H01L 33/50* (2013.01); *H01L 33/62* (2013.01); *H01L 2933/0066* (2013.01)

(58) Field of Classification Search
CPC combination set(s) only.
See application file for complete search history.

(56) References Cited

U.S. PATENT DOCUMENTS

| | | | |
|---|---|---|---|
| 10,411,210 B2 | 9/2019 | Bibl et al. | |
| 2011/0254987 A1* | 10/2011 | Massetti | H04N 5/374 348/308 |
| 2013/0234104 A1* | 9/2013 | Herner | H01L 27/2418 257/5 |

OTHER PUBLICATIONS

S.B.Herner, A. Bandyopadhyay, S.V. Dunton, V. Ekcert, J. Gu, K.J. Hsia, S. Hu, C. Jahn, D. Kidwell, M. Konevecki, M. Mahajani, K. Park, C. Petti, S.R. Radigan, U. Raghuram, J. Vienna, and M.A. Vyvoda, "Vertical p-i-n polysilicon diode with antifuse for stackable field-programmable ROM," IEEE Electron Device Letters, May 2004, pp. 271-273, vol. 25 No. 5, IEEE Piscataway, NJ, USA.

\* cited by examiner

*Primary Examiner* — Ratisha Mehta
(74) *Attorney, Agent, or Firm* — Scott Brad Herner

(57) ABSTRACT

Devices and methods of their fabrication for pixels or displays are disclosed. Pixels and displays having redundant subpixels are described. Subpixels are initially isolated by an unprogrammed antifuse. A subpixel is connected to the display by programming the antifuse, electrically connecting it to the pixel or display. Defective subpixels can be determined by photoluminescent testing or electroluminescent testing, or both. A redundant subpixel can replace a defective subpixel before pixel or display fabrication is complete.

12 Claims, 20 Drawing Sheets

PIXEL OR DISPLAY WITH SUB PIXELS SELECTED BY ANTIFUSE PROGRAMMING

RELATED APPLICATIONS

This application is a continuation of U.S. application Ser. No. 17/085,088, filed Oct. 30, 2020, the entire contents of which is incorporated herein by reference.

FIELD

The embodiments of the invention are directed generally to pixels and displays, especially to those using micro light emitting diodes (LEDs), and methods to manufacture pixels and displays. The embodiments include pixels and displays with redundant subpixels wherein a functional subpixel can replace a defective subpixel before fabrication is complete.

BACKGROUND INFORMATION

Displays have become ubiquitous with sizes ranging from very large, such as those utilized in sports stadiums, to very small, such as those in watches, and various applications, including projections of small images onto large surfaces and virtual reality headsets. There is need for higher resolution in small displays, particularly for the latter two applications. There is also a need for energy-efficient displays, as many displays are powered by batteries.

Active matrix displays, in which individual pixels are driven by circuitry, are advantageous for high resolution and better image quality compared to passive matrix displays. Active matrix displays with semiconductor-based micro LEDs are well suited for small, energy-efficient displays due to their efficiency, brightness, and small size. Micro LEDs are smaller in size than standard LEDs. For example, a standard LED used in liquid crystal flat panel display may have a largest dimension of 200 microns. A micro LED may have a largest dimension of 50 microns or less. Micro LEDs have greater luminous efficiency and can be arranged in higher pixel densities than standard LEDs, making them good candidates for the luminous source in a small, high resolution display.

Fabrication of displays with micro LEDs poses challenges compared with standard LEDs. Pick-and-place tools used with standard LEDs do not work with micro LEDs. Even if pick-and-place tools could be developed to work with micro LEDs, it is advantageous to incorporate very large numbers of micro LEDs into a display, and the relatively slow speed of pick-and-place tools would be cost prohibitive to fabricating a display with, for example, millions of micro LEDs. Different methods to fabricate micro LEDs into the display must therefore be developed. Methods that incorporate hundreds, thousands, or millions of micro LEDs simultaneously into a display can make micro LED displays cost effective.

The replacement of defective micro LEDs or replacement of defective subpixels during manufacture of a display must also be considered. In many applications, standard size LEDs are fabricated and tested individually to verify functionality prior to incorporation into a display. But this approach is not feasible for fabrication methods that incorporate hundreds, thousands, or millions of micro LEDs simultaneously into a display. New methods that allow for the replacement of defective micro LEDs and/or subpixels can allow for the production of cost effective defect-free displays or displays with very low levels of defects.

SUMMARY

Devices and methods of their fabrication for pixels or displays are described. In an embodiment, a pixel comprises a plurality of data lines, wherein each data line is coupled to a data circuit, a plurality of select lines, wherein each select line is coupled to a select circuit, a plurality of first group subpixels, and a plurality of second group subpixels. Each first group subpixel comprises at least one first group LED, a first group control circuit coupled to the first group LED, and a first group antifuse disposed between a select line and the first group control circuit. Each second group subpixel comprises at least one second group LED, a second group control circuit coupled to the second group LED, and a second group antifuse disposed between a select line and the second group control circuit.

In an embodiment, a pixel comprises a plurality of data lines, wherein each data line is coupled to a data circuit, a plurality of select lines, wherein each select line is coupled to a select circuit, a plurality of first group subpixels, and a plurality of second group subpixels. Each first group subpixel comprises at least one first group LED, a first group control circuit coupled to the first group LED, and a first group antifuse disposed between a data line and the first group control circuit. Each second group subpixel comprises at least one second group LED, a second group control circuit coupled to the second group LED, and a second group antifuse disposed between a data line and the second group control circuit.

In an embodiment, a pixel comprises a plurality of data lines, wherein each data line is coupled to a data circuit, a plurality of select lines, wherein each select line is coupled to a select circuit, a plurality of power lines, a plurality of first group subpixels, and a plurality of second group subpixels. Each first group subpixel comprises at least one first group LED, a first group control circuit coupled to the first group LED, and a first group antifuse disposed between a power line and the first group control circuit. Each second group subpixel comprises at least one second group LED, a second group control circuit coupled to the second group LED, and a second group antifuse disposed between a power line and the second group control circuit.

In an embodiment, a display panel comprises a plurality of data circuits, a plurality of select circuits, and a plurality of subpixels arranged in a two dimensional array. Each subpixel comprises an LED, a control circuit coupled to the LED, and an antifuse disposed between the control circuit and a select circuit.

In an embodiment, a display panel comprises a plurality of data circuit, a plurality of select circuits, and a plurality of subpixels arranged in a two dimensional array. Each subpixel comprises an LED, a control circuit coupled to the LED, and an antifuse disposed between the control circuit and a data circuit.

In an embodiment, a method to make a pixel is described. The steps comprise providing a backboard with a plurality of data circuits and a plurality of select circuits. A plurality of control circuits and a plurality of antifuses are formed on a transistor substrate. Each antifuse is coupled to a control circuit. A plurality of LEDs is formed on an LED substrate. The plurality of LEDs is then bonded to the plurality of control circuits, resulting in each LED is being coupled to a control circuit. The control circuits are then bonded to the backboard. After bonding the control circuits to the backboard, an antifuse is disposed between each control circuit and either a data circuit or a select circuit.

BRIEF DESCRIPTION OF THE DRAWINGS

The drawings are idealized representations to describe embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. The drawings may show components in fewer numbers but in larger sizes than actually the case. Like numerals refer to like components throughout.

For the sake of explanation, the present disclosure will adopt an X-Y-Z orthogonal coordinate system. The term "largest dimension" is to mean the largest dimension in one of the X-Y-Z directions. The features, aspects, and advantages of the embodiments described herein will become better understood with regard to the following description, appended claims, and accompanying drawings, where:

DETAILED DESCRIPTION OF EMBODIMENTS

In this application, pixels, displays, and methods to make them are described. A pixel comprises one or more subpixels. The embodiments of the pixels and displays described will comprise redundant subpixels. The pixel or display in these embodiments will have more subpixels than is needed to make the pixel or display functional. If a subpixel is found to be defective by testing during manufacture, a redundant subpixel can be selected to replace the defective subpixel. The pixel or display will be initially fabricated with at least some, if not all, of the subpixels electrically isolated by an unprogrammed antifuse. An antifuse is a device that is fabricated in a highly resistive state, also called an unprogrammed state, and becomes permanently conductive being programmed, called a programmed state. It is to be appreciated that when reference is made to an antifuse, the antifuse may be in either an unprogrammed or programmed state. An unprogrammed antifuse electrically isolates a device. A programmed antifuse does not electrically isolate a device. During manufacture, the subpixels can be tested for light emission. If the LED of the subpixel is determined to emit functional light, then the subpixel is connected to other circuitry in the pixel or display by programming the antifuse with a voltage pulse. In general, defective subpixels are replaced by redundant functional subpixels by programming the antifuse of the redundant subpixels. In some cases, a subpixel with a programmed antifuse may be defective and not emit light, in which case it is replaced by a redundant functional subpixel.

Active matrix displays can be a two dimensional array of pixels. Each pixel in a color active matrix display must be capable of emitting almost any color. One method to achieve pixel color is to combine the primary colors of three or more subpixels. Each subpixel emits light of a single primary color. For example, a pixel may comprise three subpixels, one of which may emit red light, another emits green light, and the final one emits blue light. By emitting light from one, two, or all three subpixels and by varying the intensity of light from these three subpixels, the light output of the pixel may appear to be almost any color or intensity.

Several embodiments describing pixels or displays comprising redundant subpixels, methods to identify functional subpixels and connect them electrically to other circuitry, and fabrication methods for these pixels and displays are described in the disclosure. The disclosure will be divided into three parts: I) embodiments of pixels and displays, II) embodiments of methods to test subpixels and program antifuses of selected subpixels, and III) an embodiment of a method to manufacture pixels and displays.

I Embodiments of Pixels and Displays

Figure 1A:
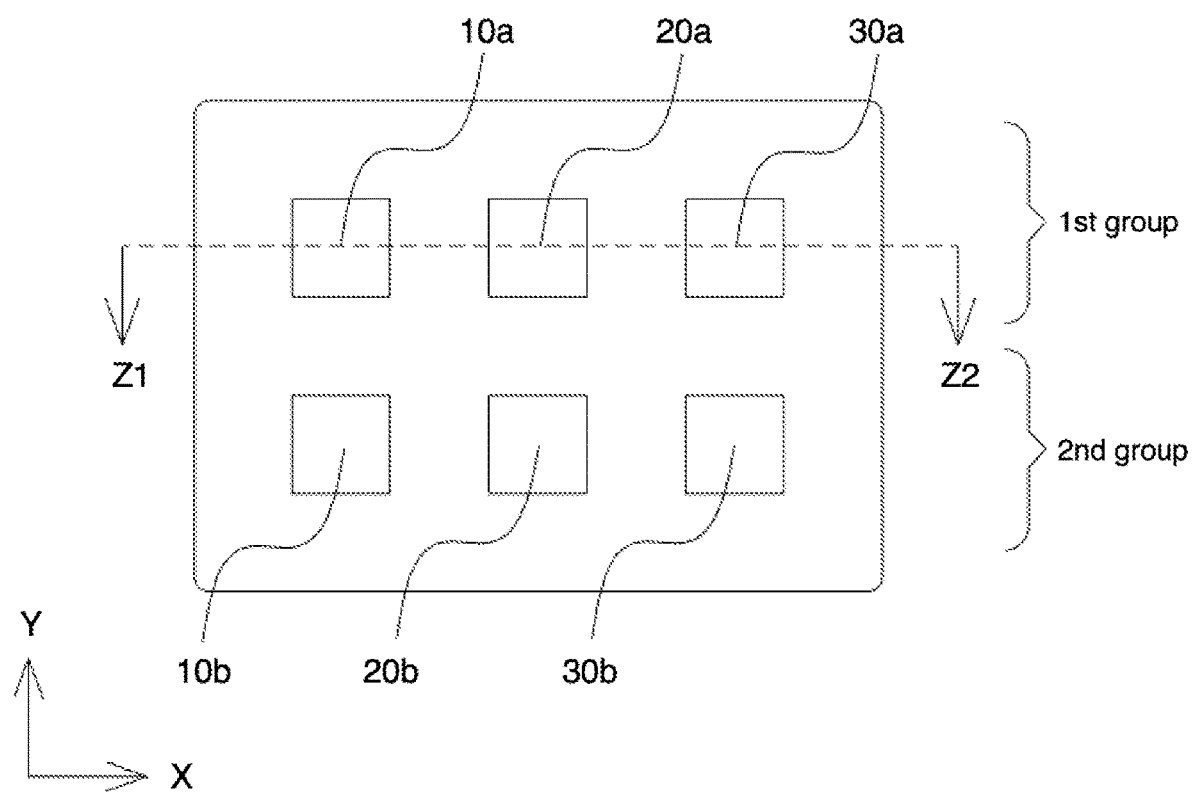
FIG. 1A is a plan view schematic of a pixel in accordance with an embodiment of the invention.

FIG. 1A is a plan view of one embodiment of a pixel according to the present invention. Pixel 6 comprises six subpixels 10a, 20a, 30a, 10b, 20b, and 30b. The subpixels are arranged in two groups, with a plurality of first group subpixels 10a, 20a, and 30a, and a plurality of second group subpixels 10b, 20b, and 30b. The second group subpixels are redundant to the first group subpixels.

Figure 1B:
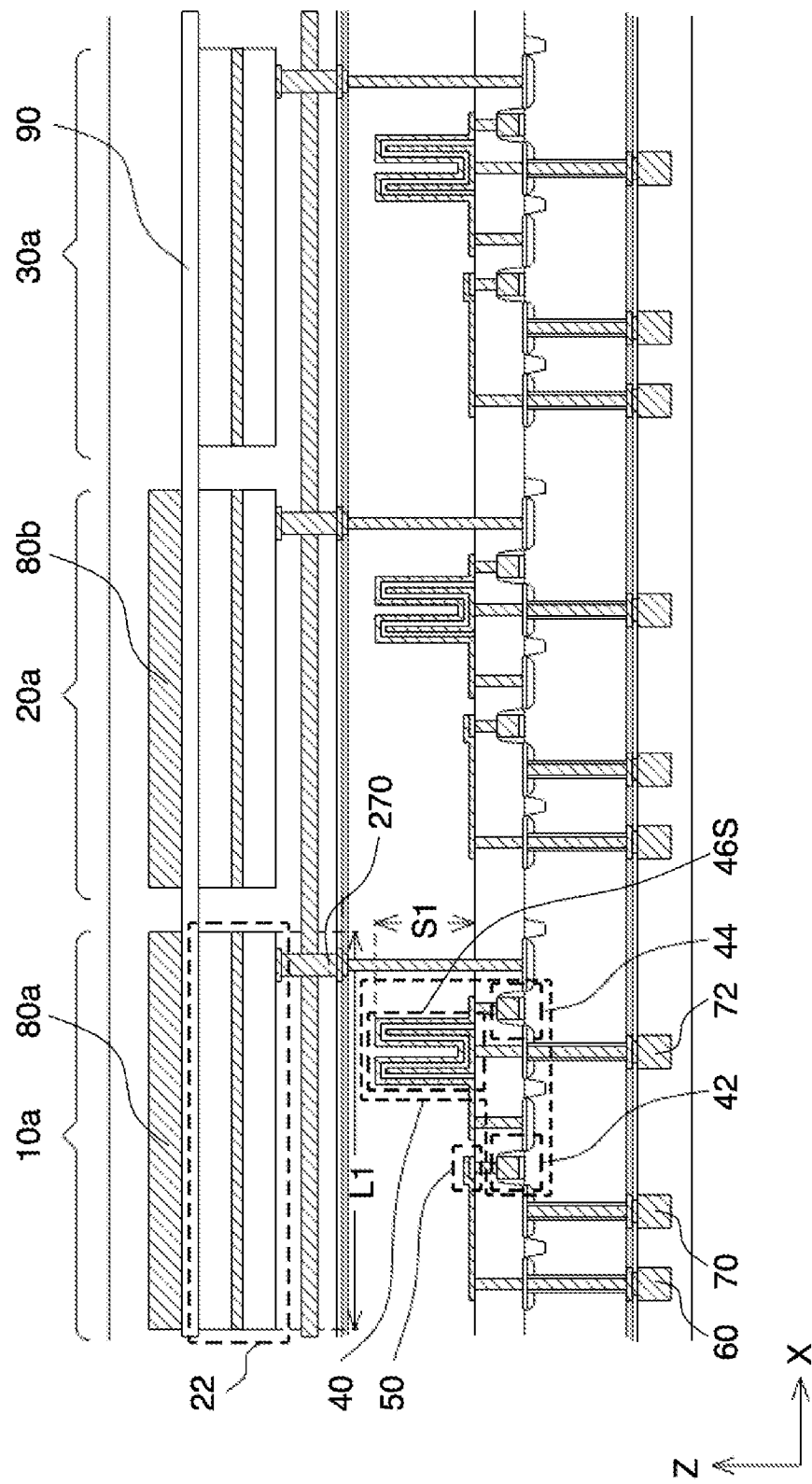
FIG. 1B is a cross-sectional schematic of a portion of pixel in accordance with an embodiment of the invention.

FIG. 1B is a cross-section Z1-Z2 through pixel 6 in FIG. 1A. Cross-section Z1-Z2 shows first group subpixels 10a, 20a, and 30a. First group subpixel 10a will be described in detail, and first group subpixels 20a and 30a share many similar elements to first group subpixel 10a. There are a plurality of select lines 60, a plurality of data lines 70, and a plurality of power lines 72. First group subpixel 10a comprises a first group LED 22, a first group control circuit 40, and a first group antifuse 50. LED 22 can be a micro LED having a largest dimension L1 in either the X or Y dimensions of 50 microns or less, although suitable larger dimensions are possible. First group antifuse 50 is disposed between first group control circuit 40 and a select line 60. Select line 60 is a conductive interconnect that is coupled to a select circuit (not shown) and first group antifuse 50. Data line 70 is a conductive interconnect that is coupled to a data circuit (not shown) and first group control circuit 40. A wavelength-converting layer 80a overlies first group LED 22 of first group subpixel 10a. In this embodiment, first group subpixel 20a also comprises a wavelength-converting layer 80b and first group subpixel 30a does not have a wavelength-converting layer. A transparent conductive layer 90 is electrically connected to substantially all of one surface of one side of the LEDs of the subpixels. First group subpixels 10a, 20a, and 30a may each emit a different primary color of light, for example, red, green, and blue, respectively. First group control circuit 40 comprises transistors 42 and 44, and a capacitor 46S. In this embodiment transistors 42 and 44 comprise single crystal semiconductor. Capacitor 46S is a stack capacitor. A stack capacitor has its largest dimension S1 in the Z direction. Second group subpixels 10b, 20b, and 30b have the same cross-sectional schematic as first group subpixels 10a, 20a, and 30a. Summarizing, FIGS. 1A and 1B show pixel 6 comprising a plurality of data lines 60 wherein each data line is coupled to a data circuit (not shown), a plurality of select lines 70 wherein each select line is coupled to a select circuit (not shown), a plurality of first group subpixels 10a, 20a, and 30a, and a plurality of second group subpixels 10b, 20b, and 30b. First group subpixel 10a comprises first group LED 22, first group control circuit 40 coupled to LED 22, and first group antifuse 50 disposed between select line 60 and first group control circuit 40. Second group subpixel 10b comprises a second group LED, a second group control circuit coupled to the second group LED, and a second group antifuse disposed between a select line and the second group control circuit.

Figure 2:
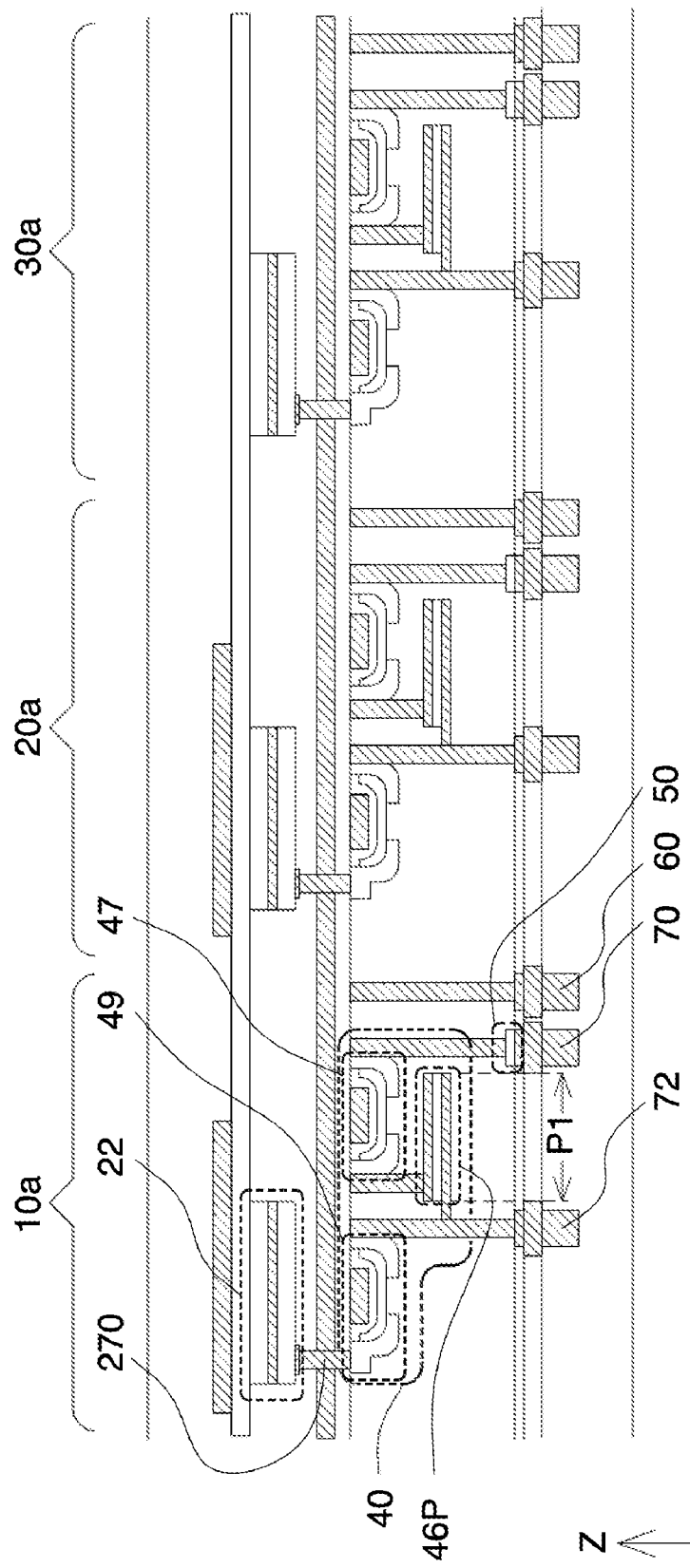
FIG. 2 is a cross-sectional schematic of a portion of pixel in accordance with an embodiment of the invention.

FIG. 2 is another embodiment of first group subpixels 10a, 20a, and 30a of pixel 6. In the embodiment shown in FIG. 2, the transistors 47 and 49 of control circuit 40 are thin film transistors. Thin film transistors comprise amorphous or polycrystalline semiconductor. The embodiment shown in FIG. 2 shows gate-first transistors, but other embodiments of the invention could employ gate-last transistors. The capacitor 46P is a planar capacitor. Planar capacitor 46P has its largest dimension P1 in the X or Y direction. First group antifuse 50 is disposed between first group control circuit 40 and a data line 70. Data line 70 is a conductive interconnect that is coupled to a data circuit (not shown). Select line 60 is a conductive interconnect that is coupled to a select circuit (not shown). Select line 60 is coupled to transistor 47 through an interconnect not visible in the cross-section schematic of FIG. 2. Summarizing, FIGS. 1A and 2 show pixel 6 comprising a plurality of data lines 70 wherein each data line is coupled to a data circuit (not shown), a plurality of select lines 60 wherein each select line is couple to a select circuit (not shown), a plurality of first group subpixels 10a, 20a, and 30a, and a plurality of second group subpixels 10b, 20b, and 30b. First group subpixel 10a comprises first group LED 22, first group control circuit 40 coupled to LED 22, and first group antifuse 50 disposed between data line 70 and first group control circuit 40. Second group subpixel 10b comprises second group LED 22, second group control circuit 40 coupled to second group LED 22, and second group antifuse 50 disposed between data line 70 and second group control circuit 40.

Figure 3:
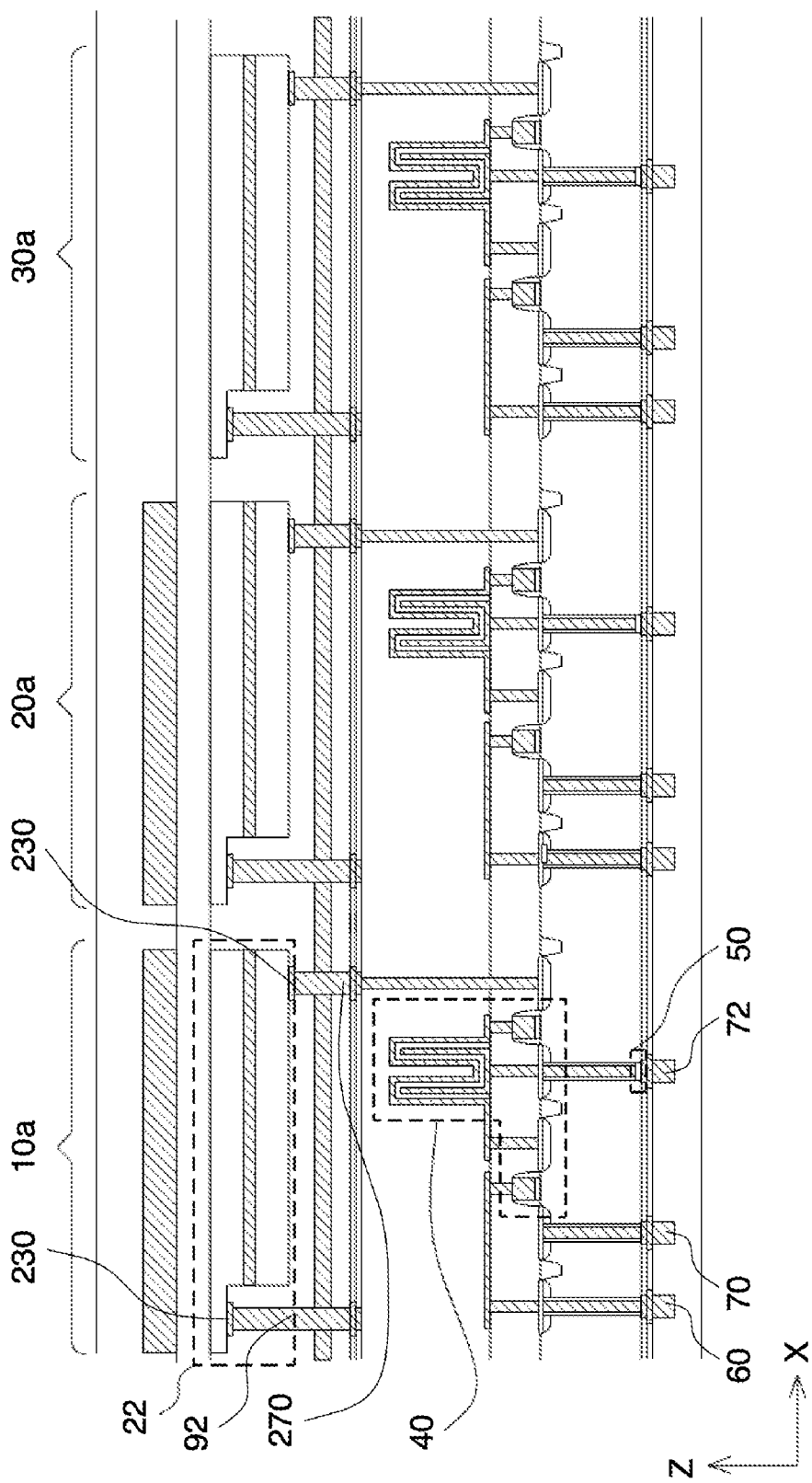
FIG. 3 is a cross-sectional schematic of a portion of pixel in accordance with an embodiment of the invention.

Turning to FIG. 3, another embodiment of the device is shown in cross-section. In this embodiment, both sides of the LEDs of each subpixel are coupled to a metal pad and LED vertical interconnects 92 and 270, with one side coupled to a ground (not shown) and one side coupled to control circuit 40. LED 22 has ohmic contacts 230 on either side of the LED. In this example, LED contact 230 makes contact with only a small portion of the surface area of either side of the LED. In the embodiments shown in FIGS. 1b and 2, transparent conductive layer 90 makes contact to substantially all of the surface area of one side of LED 22. In this embodiment, first group antifuse 50 is disposed between first group control circuit 40 and a power line 72. Summarizing, FIGS. 1A and 3 show pixel 6 comprising a plurality of data lines 60 wherein each data line is coupled to a data circuit (not shown), a plurality of select lines 70 wherein each select line is couple to a select circuit (not shown), a plurality of first group subpixels 10a, 20a, and 30a, and a plurality of second group subpixels 10b, 20b, and 30b. For example, first group subpixel 10a comprises first group LED 22, first group control circuit 40 coupled to LED 22, and first group antifuse 50 disposed between power line 72 and first group control circuit 40. Second group subpixel 10b comprises a second group LED 22, second group control circuit 40 coupled to second group LED 22, and second group antifuse 50 disposed between power line 72 and second group control circuit 40.

II Methods to Test Subpixels and Program Antifuses of Selected Subpixels

Figure 4A:
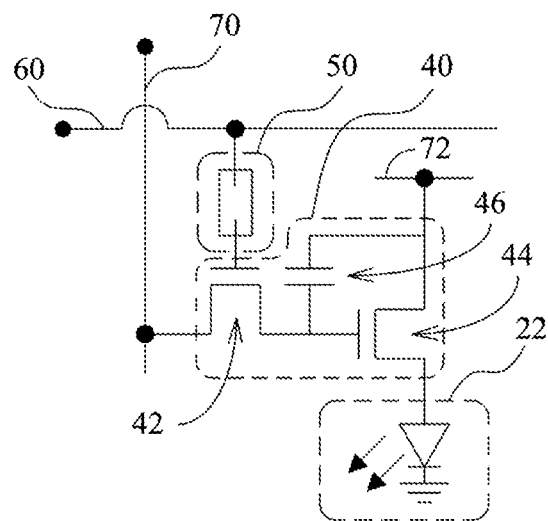
FIG. 4A is a circuit diagram of a subpixel in accordance with an embodiment of the invention.

FIG. 4A is a circuit diagram of first group subpixel 10a according to one embodiment of the present invention. It is important to note that the description of a second group subpixel would be similar to a first group subpixel. In this embodiment, first group subpixel 10a comprises a first group LED 22, a first group control circuit 40, and a first group antifuse 50. First group control circuit 40 modulates the light output of first group LED 22. First group antifuse 22 renders first group control circuit 40 nonfunctional when it is unprogrammed. When sufficient voltage is applied to program first group antifuse 50, first group control circuit 40 becomes functional. First group control circuit 40 is known as a 2T1C circuit, as it has two transistors and one capacitor. One transistor in first group control circuit 40, known as the drive transistor 44, controls the brightness of first group subpixel 10a. The source or drain of drive transistor 44 is connected to an electrode of first group LED 22. The other transistor in first group control circuit 40, known as the select transistor 42, has its source or drain connected to data line 70, its gate connected to select line 60 with antifuse 50 disposed between transistor 42 and select line 60. When select transistor 42 is turned on by select line 60, the voltage is transferred to the to the gate of drive transistor 44 through select transistor 42 and stored in capacitor 46. Drive transistor 44 converts the voltage to current that is provided to LED 22. The circuit diagram of FIG. 4A represents the cross-sectional schematic of FIG. 1B, where first group antifuse 50 is disposed between control circuit 40 and select line 60.

It is to be appreciated that an unprogrammed first group antifuse 50 renders first group subpixel 10a nonfunctional. Only after first group antifuse 50 is programmed is first group subpixel 10a functional. First group antifuse 50 is programmed by receiving a high voltage pulse through select line 60. In general, the voltage necessary to program the first group antifuse will be substantially higher than the standard operating voltage of the first group control circuit. In one example, the operating voltage of control circuit 40 may about 4 volts, while the programming pulse necessary to program antifuse 50 is about 14 volts. In this manner, a first group subpixel with an unprogrammed first group antifuse will not have the first group antifuse programmed by a standard select or data signal used for image transmission. Rather, the first group antifuse is only programmed by a higher voltage specifically used only for programming the first group antifuse.

Figure 4B:
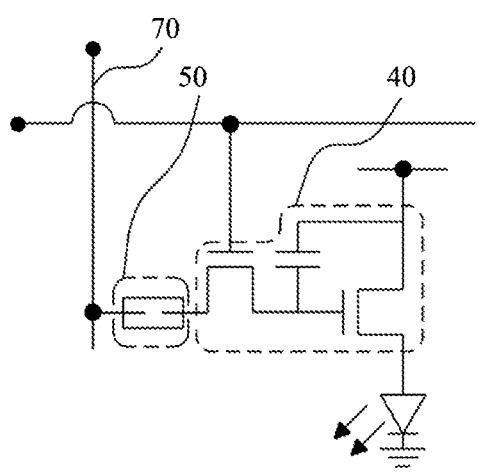
FIG. 4B is a circuit diagram of a subpixel in accordance with an embodiment of the invention.

Although first group antifuse 50 in FIG. 4A is in the current path between data line 70 and first group control circuit 40, which is also shown in cross-section in FIG. 1B, other configurations are possible. Another embodiment is shown in FIG. 4B, where first group subpixel 10a has first group antifuse 50 disposed between data line 70 and first group control circuit 40, which is also shown in cross-section in FIG. 2. Again, first group subpixel 10a is nonfunctional while first group antifuse 50 is unprogrammed, and functional when first group antifuse 50 has been programmed. The voltage pulse to program antifuse 50 is delivered through data line 70.

Figure 4C:
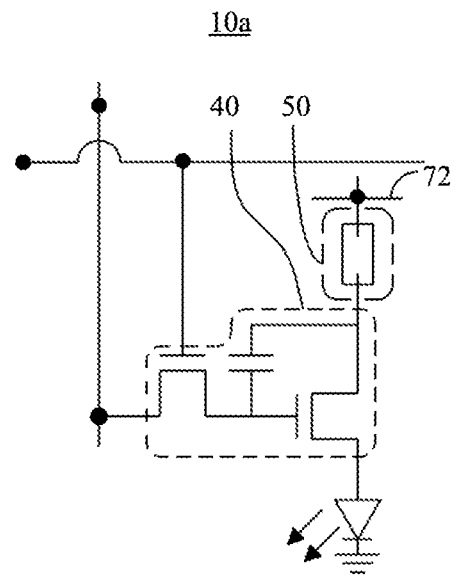
FIG. 4C is a circuit diagram of a subpixel in accordance with an embodiment of the invention.

Another embodiment is shown in FIG. 4C, where first group subpixel 10a has first group antifuse 50 disposed between power line 72 and first group control circuit 40, which is also shown in cross-section in FIG. 3. Again, first group subpixel 10a is nonfunctional while first group antifuse 50 is unprogrammed, and functional when first group antifuse 50 has been programmed. The voltage pulse to program antifuse 50 is delivered through power line 72.

Any suitable control circuit configuration may be used, and the 2T1C control circuit is just one example. Another example of a control circuit for an LED uses four transistors and two capacitors.

Figure 5A:
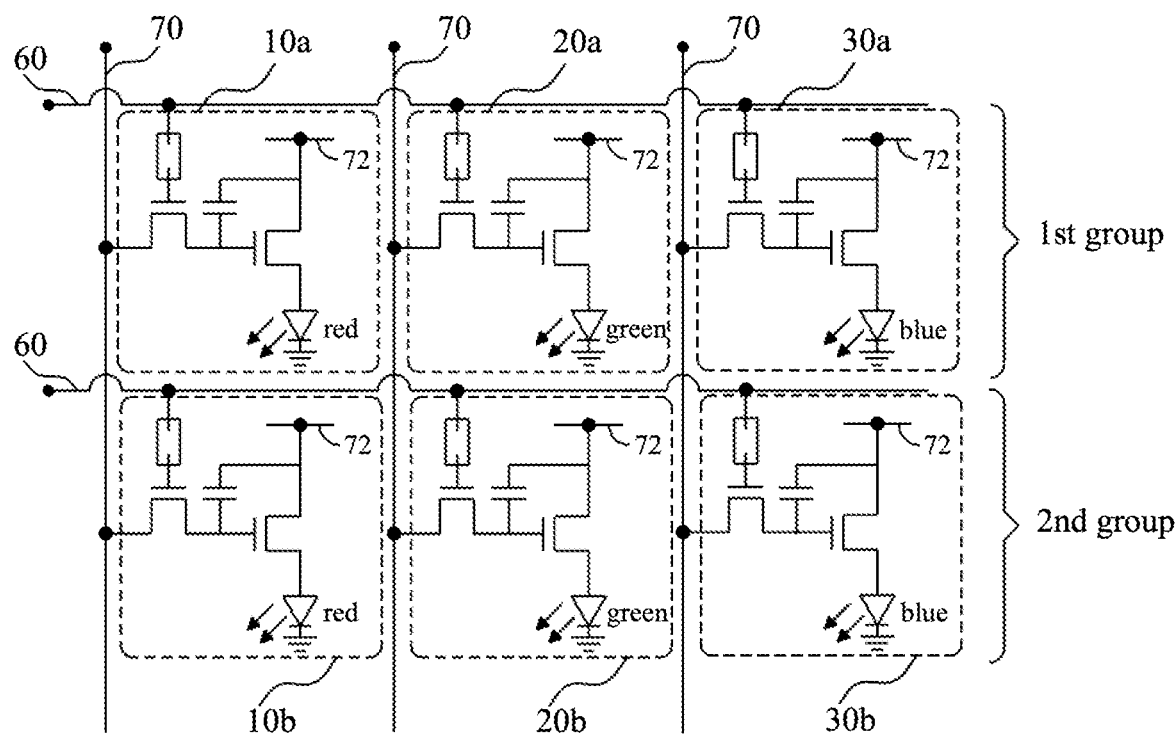
FIG. 5A is a circuit diagram of a pixel in accordance with an embodiment of the invention.

One or more subpixels can form a pixel. FIG. 5A is a circuit diagram of pixel 6 shown in plan view schematic in FIG. 1A. Pixel 6 comprises first group subpixels 10a, 20a, 30a, second group subpixels 10b, 20b, and 30b, data lines 70, select lines 60, and power lines 72. In this example, for each first group subpixel there is one second group subpixel. The second group of subpixels is redundant to the first group of subpixels. Throughout this application, reference to first group subpixels refers to the initial group of subpixels which are selected to comprise the pixel or display, while the second group of subpixels will refer to redundant subpixels that can replace a defective first group subpixel. Functional second group subpixels can also replace defect second group subpixels. For example, subpixel 10b in the second group is redundant to subpixel 10a in the first group. Each redundant subpixel emits light of the same color as the subpixel that it is redundant to. The light emitted by the subpixel and indicated in the FIG. 5A is not the same as the light emitted by the LED if the subpixel has a wavelength-converting layer. For example, a subpixel may have an LED that emits blue light that is converted to red light by a wavelength-converting layer. A redundant subpixel will replace a subpixel that is determined to be defective by testing.

Figure 5B:
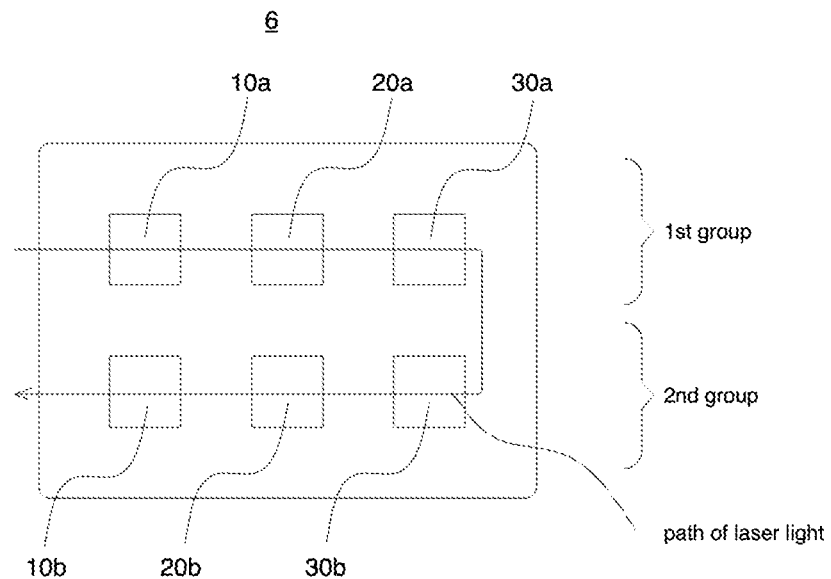
FIG. 5B is a plan view diagram of a pixel with the path of laser light for photoluminescent testing in accordance with an embodiment of the invention.

At a stage of fabrication (fabrication will be discussed in detail in Section III) before pixel 6 is complete, all of the antifuses in pixel 6 are unprogrammed (as shown by the open circuit antifuses), and therefore all of the subpixels are nonfunctional. At this stage of fabrication, no wavelength-converted layers have been added to the partially completed pixel. The LEDs in the subpixels are first tested for functionality by photoluminescence. FIG. 5B shows a plan view schematic of pixel 6 shown in the circuit diagram of FIG. 5A. A light source such as a laser (not shown) is directed at the LEDs of the pixel, inducing the LEDs to emit light by photoluminescence. The light source may have all suitable wavelengths to induce all the LEDs to emit light. In other embodiments, the light source may have a wavelength or wavelengths suitable to induce only a fraction of the LEDs to induce light. A line scan camera (not shown) then records the light output of each LED by following the racetrack-like path indicated in FIG. 5B. A recording of the light emission information for each subpixel is stored on a computer. If the light source induces emission in only a fraction of the subpixels, then multiple passes of a light source with different dominant wavelengths may be needed to induce all the subpixels to emit light.

If the LEDs of first group subpixels 10a, 20a, and 30a are determined to be functional by photoluminescent testing, then the antifuses of these subpixels are programmed, coupling each subpixel to a select circuit. Programming the antifuse involves a pulse of electricity with sufficient voltage to rupture the dielectric layer in the antifuse (antifuse construction will be discussed in detail in section III). The information on LED functionality from photoluminescent testing is used to determine which subpixels should have their respective antifuse programmed. Each programmed antifuse electrically connects the control circuit of a subpixel to an external device. If the LED of any of the first group subpixels 10a, 20a, or 30a is determined not to be functional by photoluminescence, the antifuse of that first subpixel is not programmed. The antifuse of the redundant second group subpixel to the defective first group subpixel is then programmed.

Figure 5C:
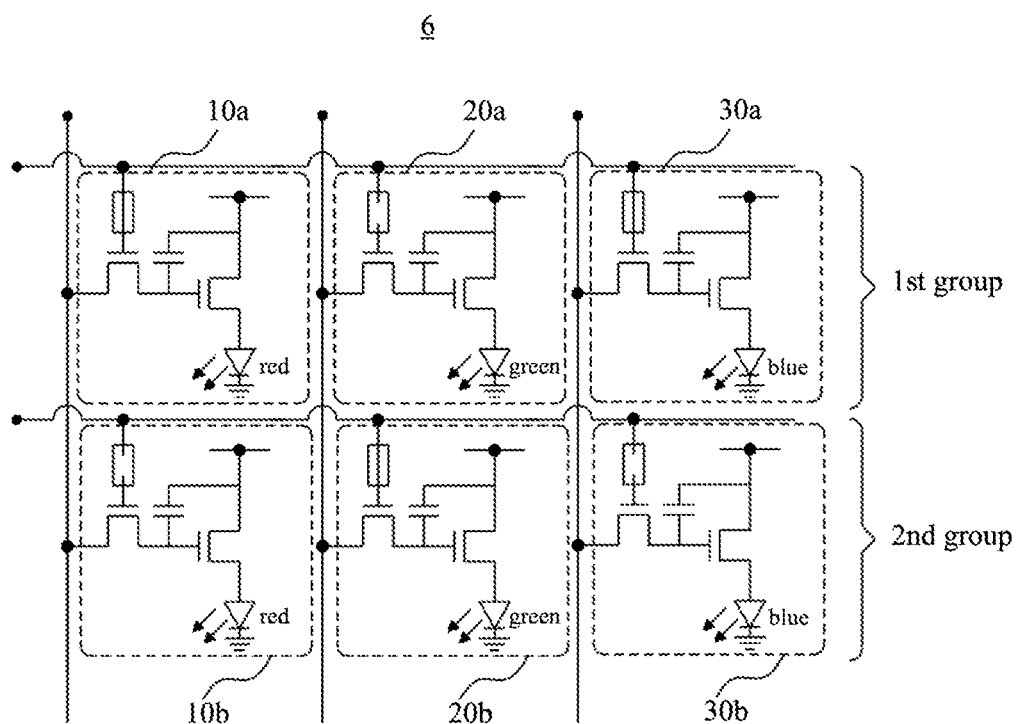
FIG. 5C is a circuit diagram of a pixel after testing and antifuse programming in accordance with an embodiment of the invention.

In one example, subpixels 10a, 30a, 10b, 20b, and 30b of pixel 6 shown in FIG. 5A were determined to have LEDs with functional light output by photoluminescent testing, while subpixel 20a was determined to have a defective LED and is therefore nonfunctional. Accordingly, the antifuses of first group subpixels 10a and 20a and second group subpixel 20b were programmed (as shown by the closed circuit in the circuit diagram), while the antifuses of first group subpixel 20a and second group subpixels 10b and 30b were not programmed, as shown in FIG. 5C.

LEDs may be defective for a variety of reasons. The LED may be cracked, there may be crystallographic defects such as line dislocations, there may be shorting between conductive layers of the LED, or there may be contamination in the LED. Each of these defects may render the LED unable to produce light of sufficient intensity or wavelength to be functional.

Figure 5D:
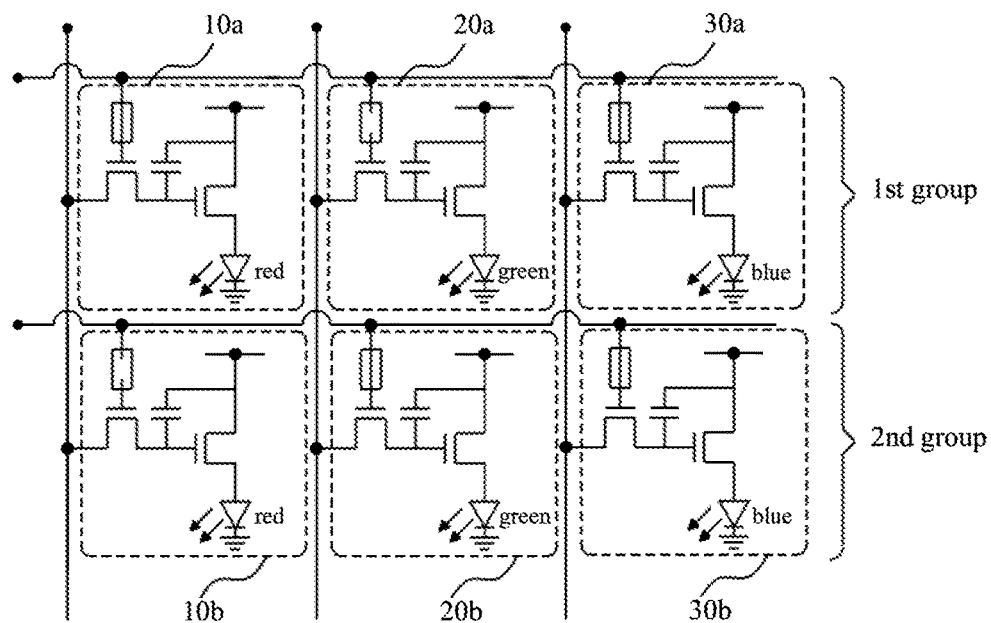
FIG. 5D is a circuit diagram of a pixel after testing and antifuse programming in accordance with an embodiment of the invention.

After the subpixels have been tested by photoluminescent emission and appropriate antifuses programmed to connect the subpixels to the select lines, the subpixels may be tested a second time. The second test may occur after a wavelength-converting layer has been added to the subpixel, as will be discussed in section III. In this second test, appropriate voltages and currents are applied to the data lines, select lines, and power lines of the selected subpixel, causing the control circuit to admit current to the LED, causing the LED to emit light by electroluminescence. Only those subpixels with a programmed antifuse will have the data line electrically connected to a subpixel and therefore be able to emit light. A line scan camera again records the light output of each LED and a registry of the information is stored on a computer. In the preceding example shown in FIG. 5C, the LED of subpixel 20a was determined to be defective while the LEDs of subpixels 10a, 30a, 10b, 20b, and 30b were determined to be functional by photoluminescence. After programming antifuses to subpixels 10a, 20b, and 30a, the subpixels were tested a second time, this time by electroluminescence. In one example, first group subpixel 10a and second group subpixel 20b were determined to be functional and first group subpixel 30a was defective by electroluminescent testing. The antifuse of second group subpixel 30b is then programmed, and second group subpixel 30b replaces defective first group subpixel 30a, as shown in FIG. 5D. Finally in this example, pixel 6 would comprise functional subpixels 10a, 20b, and 30b. While first group subpixel 30a has a programmed antifuse, the subpixel is defective, as was determined by electroluminescent testing, and does not emit light. Second group subpixel 30b has replaced first group subpixel 30a.

In the example above, the antifuse was disposed between the control circuit and a select line of the subpixel. In other embodiments where the antifuse is disposed between the control circuit and a data line, or between the control circuit and a power line, similar methods of testing and programming would apply.

It is important to distinguish the two kinds of light testing: photoluminescent and electroluminescent. In photoluminescent testing, the LED of each subpixel is tested before the subpixel is connected to programming circuitry, and the functionality of only the LED is determined by stimulating light emission from another light source. In electroluminescent testing, the entire subpixel including the LED and control circuit is tested for functionality by operating the subpixel with electrical current. In electroluminescent testing, other defects, such as a poor contact to the LED, a broken interconnect, or a defective transistor may render the subpixel defective despite having a programmed antifuse. So electroluminescent testing may expose other defects, such as those related to the control circuit or interconnects in addition to LED-related defects, while photoluminescent testing determines only LED-related defects. Also, electroluminescent testing can be done after wavelength-converting layers are fabricated, while photoluminescent testing is done before wavelength-converting layers are fabricated.

In another embodiment, the subpixel may be tested by photoluminescent testing-only, and not by electroluminescent testing. In yet another embodiment, the subpixel may be tested by electroluminescent testing-only, and not by photoluminescent testing. If the subpixel is tested by electroluminescent testing-only, the antifuses of the first group subpixels are programmed before electroluminescent testing. Replacement of defective first group subpixels with functional second group subpixels then proceeds as described above. Electroluminescent testing requires the antifuse to be programmed.

Figure 5E:
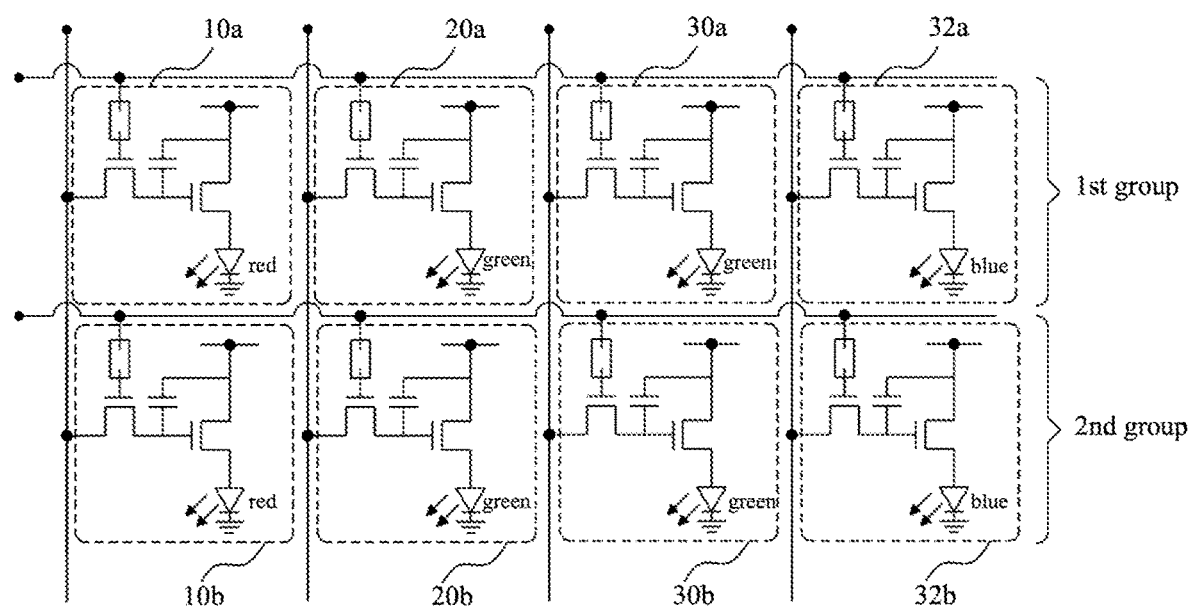
FIG. 5E is a circuit diagram of a pixel in accordance with an embodiment of the invention.
Figure 5F:
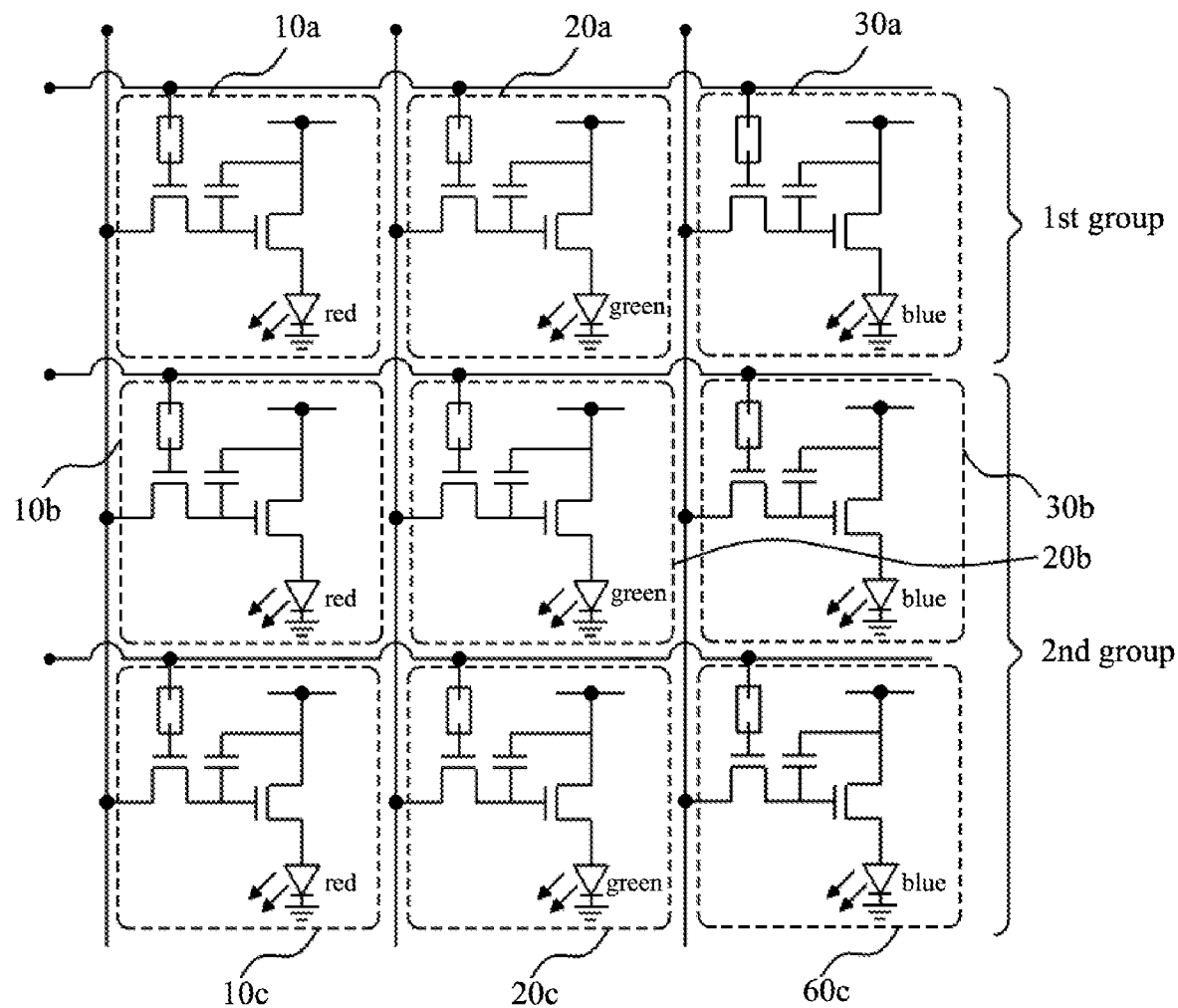
FIG. 5F is a circuit diagram of a pixel in accordance with an embodiment of the invention.

In other embodiments, the pixel may comprise more than one primary subpixel per color. For example, as shown in FIG. 5E, pixel 7 has first group subpixels 10a, 20a, 30a, and 32a, and second group subpixels 10b, 20b, 30b, and 32b. Subpixels 10a and 10b emit red light, subpixels 20a, 30a, 20b, and 30b emit green light, and subpixels 32a and 32b emit blue light. Varying numbers of subpixels per primary color can allow light intensity to be balanced in the finished pixel. In still other embodiments, there may be more than one redundant second group subpixel per first group subpixel. For example, as shown in FIG. 5F, pixel 8 comprises first group subpixels 10a, 20a, and 30a, and second group subpixels 10b, 20b, 30b, 10c, 20c, and 30c. In this example, there are two redundant second group subpixels for each first group subpixel. With multiple redundant second group subpixels, if a redundant second group subpixel is found to be defective by testing, it can be replaced with another redundant second group subpixel.

Figure 6:
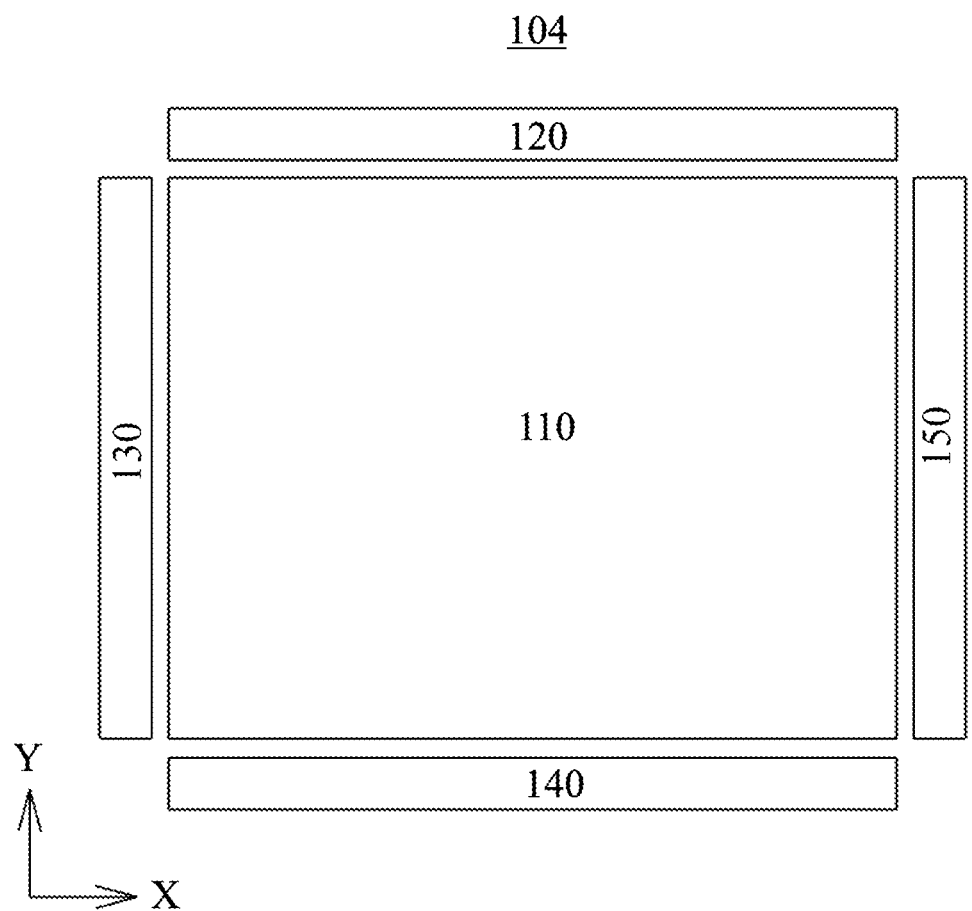
FIG. 6 is a plan view schematic of a display in accordance with an embodiment of the invention.

A plurality of pixels can be incorporated into a two dimensional array to form a display. FIG. 6 is a top view of a display 104 according to an embodiment of the present invention. Display 104 comprises a pixel array area 110 which includes a plurality of subpixels including redundant subpixels, and data circuits 120 and scan circuits 130 that connect to the pixel array area 110. The subpixels in pixel array area 110 are arranged in a two dimensional array, and the subpixels comprise an antifuse. Ground tie lines 140 and power lines 150 also connect to pixel array area 110. Similar to the description above for a single pixel, the array of pixels can be tested by photoluminescence and electroluminescence, and the appropriate subpixels can have their antifuses programmed. Summarizing, an embodiment of a display panel comprises a plurality of data circuits, a plurality of select circuits, and a plurality of subpixels arranged in a two dimensional array. Each subpixel has an LED, a control circuit coupled to the LED, and an antifuse disposed between the control circuit and either a data circuit or a select circuit.

The display may incorporate hundreds, thousands, or millions of pixels. It is important to note that the completed display in the embodiments described operates in a manner similar to a conventional active matrix display. In an embodiment of a completed display of the present invention, the two dimensional array of subpixels receives select, data, and power signals to operate individual subpixels. Subpixels with unprogrammed antifuses will be electrically isolated from display operation. As described earlier, it is possible in an embodiment that the displays can have defective subpixels with programmed antifuses. So even the though the defective subpixels receive current through the programmed antifuse, they may not produce light. A redundant functional second group subpixel can replace a defective subpixel with a programmed antifuse.

III Methods to Fabricate a Pixel or Display

An embodiment of methods to fabricate a pixel or display will now be discussed in detail in sections III A-D. LEDs and their fabrication will be described in subsection III A. LED fabrication will occur on an LED substrate, although the LED substrate will be removed in a subsequent step. The LEDs, LED substrate, and associated elements such as passivating dielectric layers, LED vertical interconnects, and a bond pad layer will collectively be called the LED apparatus. The control circuit comprising the transistors and capacitors and the antifuse will be described in subsection III B and collectively will be called the control circuit+antifuse apparatus. A bonding process will join the LED apparatus with the control circuit+antifuse apparatus, as described in subsection III C. Next, through substrate interconnects extending from conductive regions of the transistor substrate and fabrication methods will be described in subsection III D. The bonding of the combined LED and control circuit+antifuse apparatus to a backboard will be described in subsection III E. Finally, the formation of wavelength-converting layers will be described in section III F. Other embodiment, that, for example, do not use single crystal semiconductor transistors but rather thin film transistors are possible. Methods to form thin film transistors are well known to those skilled in the art and will not be discussed.

When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, and/or after all the defined steps (except where context excludes that possibility). The fabrication processes described herein do not form a complete process flow, with the remainder of the process flow known to those of ordinary skill in the art. Only the methods and structures necessary to understand embodiments of the present invention are described herein.

III A. LED Apparatus Formation

Figure 7A:
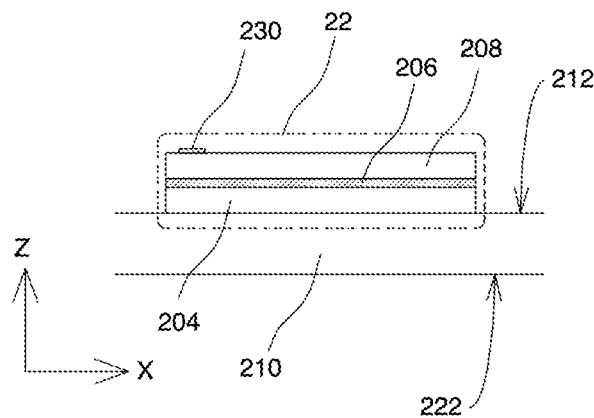
FIGS. 7A-D are cross-sectional schematics of a sequence of fabrication steps for an LED apparatus in accordance with an embodiment of the invention.

One embodiment of the LED apparatus and fabrication is now described. It is to be understood that fabrication of many LED apparatus is occurring simultaneously on the same LED substrate, although only one is shown. Turning to FIG. 7A, LED 22 is formed on an LED substrate 210. LED 22 comprises a first conductive layer 204 disposed on surface 212 of LED substrate 210, an active layer 206 disposed on first conductive layer 204, and a second conductive layer 208 disposed on active layer 206. Surface 212 is one surface of LED substrate 210, which has another substantially parallel surface 222. A masking layer (not shown) may formed on second conductive layer 208 and portions of layers 204, 206, and 208 removed by etching. The masking layer is then removed. The layers 204, 206, and 208 of LED 22 may have a rectangular shape, with longer dimensions in the X and Y directions than in the Z direction (thickness). An LED contact 230 is disposed on a portion of second conductive layer 208. In this embodiment, each of layers 204, 206, and 208 are in immediate contact with the layer below it, with no intervening layers.

First conductive layer 204, second conductive layer 208, and active layer 206 may be any suitable semiconductor layer known to those skilled in the art, including but not limited to gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide. First and second conductive layers 204 and 208 may be gallium nitride doped to opposite polarity of one another, for example, n-type and p-type or vice versa. Active layer 206 may be fabricated of any standard semiconductor materials, for example indium gallium nitride, in any formation, for example single quantum well, multiple quantum wells, or double heterostructure. In other embodiments, there may be so-called current blocking layers (not shown) above and/or below active layer 206 (i.e. the active layer 206 may be deposited on a current blocking layer, and a current blocking layer may be deposited on active layer 206). The principles and mechanisms of the conductive and active layers are well known to those skilled in the art. Any suitable method may be used to deposit LED semiconducting materials, including but not limited to metal organic chemical vapor deposition (MOCVD), hydride vapor phase epitaxy, molecular beam epitaxy, most preferably MOCVD.

LED substrate 210 may be any suitable single crystal semiconductor, although any suitable substrate material may be used, including but not limited to sapphire, silicon carbide, gallium nitride, zinc oxide, and silicon. LED substrate 210 comprises single crystal material which is substantially crystal lattice matched with first conductive layer 204. Substantially crystal lattice matched is to mean the mismatch between the two crystal lattices is less than about 25%. For example, gallium nitride and sapphire are substantially crystal lattice matched, with a lattice mismatch of 16%.

LED contact 230 may be any suitable material to make an ohmic contact to conductive layer 208, including but not limited to indium tin oxide (ITO), aluminum zinc oxide (AZO), fluorine-doped tin oxide (FTO), aluminum, silver, nickel, or a stack of a nickel layer followed by a gold layer. LED contact 230 may be deposited by any suitable technique, such as evaporation, CVD, or sputtering, most preferably evaporation. LED contact 230 may have been formed by etching a larger layer with a masking layer disposed on it (not shown), or by a lift-off technique. The masking layer is removed (not shown).

Figure 7B:
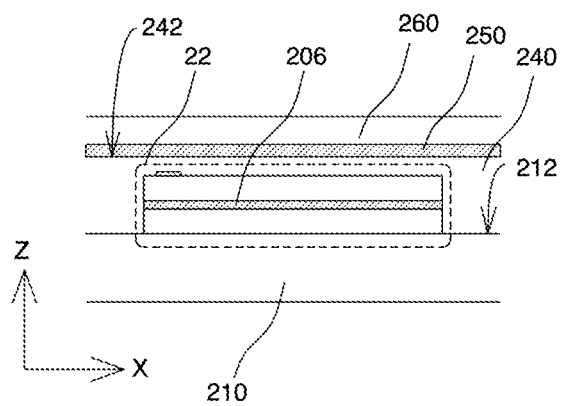

Turning to FIG. 7B, a first dielectric layer 240 is disposed on LED 22 and LED substrate 210, as shown in cross-section. First dielectric layer 240 may be any suitable material, including but not limited to silicon oxide, aluminum oxide, titanium oxide, silicon nitride, or combinations thereof, most preferably silicon oxide. First dielectric layer 240 is substantially transparent to light of the wavelength emitted by active layer 206. Substantially transparent is to mean at least 70% of the light is transmitted through the layer. First dielectric layer 240 can be deposited by any suitable technique, such as evaporation, sputtering, CVD, or spin-on techniques, most preferably by CVD. After deposition, first dielectric layer 240 may be planarized. Planarization is the process by which top surface 242 of first dielectric layer 240 is rendered substantially parallel to surface 212 of LED substrate 210. Planarization may be accomplished by any suitable technique, including but not limited to chemical mechanical planarization (CMP), wet chemical etch, or plasma etch in corrosive gas, most preferably by CMP. Subsequent steps in fabrication will be described assuming that first dielectric layer 240 of FIG. 7B has been planarized. It is to be understood that the fabrication could proceed without this planarizing step.

A reflector layer 250 is deposited on surface 242 of first dielectric layer 240. Reflector layer 250 will direct more of the light emitted by LED 22 towards the viewer in the finished pixel. In a later step, the structure shown in FIG. 7B will be inverted in the completed device. Reflector layer 250 may comprise any suitable material that substantially reflects visible light of the wavelength emitted by active layer 206 including but not limited to aluminum, gold, or silver, alloys of aluminum, gold, or silver, a composite material such as a polymer mixed with metal oxide particles, combinations thereof, or a distributed Bragg reflector (DBR), most preferably a DBR. A DBR includes one or more pairs of dielectric layers (not shown). Each dielectric layer in a pair has a different index of refraction. The dielectric layers of the DBR may be deposited by any suitable method, including evaporation, sputtering, CVD, or ALD, most preferably by evaporation. The thickness of each dielectric layer in the DBR is designed to be about one quarter of the wavelength of light that is to be reflected. The wavelength of light varies with the index of refraction of each material. For example, for an active layer of an LED that emits blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 67±7 nm thick and the titanium oxide layer is 49±5 nm thick. A reflector layer 250 that is a DBR may comprise silicon oxide, silicon nitride, aluminum oxide, tantalum oxide, or titanium oxide, or any other suitable dielectric materials. In other embodiments, a reflector layer is not deposited on first dielectric layer 240. Subsequent steps in the fabrication will be described assuming the reflector layer 250 exists. While reflector layer 250 is shown as a continuous layer in FIG. 7B, it is to be understood that the reflector layer 250 may not be continuous in all embodiments, and there may be multiple reflector layers in other embodiments. A second dielectric layer 260 is deposited on reflector layer 250. Second dielectric layer 260 may be any suitable material, including but not limited to silicon oxide, aluminum oxide, titanium oxide, silicon nitride, or combinations thereof, most preferably silicon oxide. Second dielectric layer 260 can be deposited by any suitable means, such as evaporation, sputtering, CVD, or spin-on techniques, most preferably by CVD. The thickness of second dielectric layer 260 may be between 0.05 and 10 microns, most preferably about 0.2 microns.

Figure 7C:
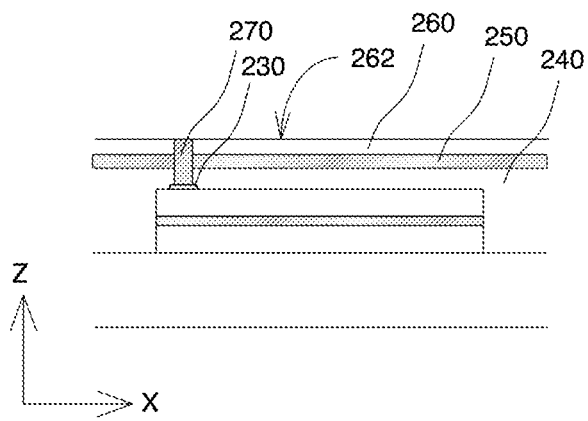

Next, an LED vertical interconnect is formed. Turning to FIG. 7C, a masking layer such as photoresist (not shown) is applied and patterned, and portions of layers 260, 250, and 240 are removed by etching in specific locations. At least a portion of LED contact 230 is exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer is then removed, leaving a cavity. LED vertical interconnect 270 is then formed in the cavity. LED vertical interconnect 270 may be deposited by any suitable technique, including but not limited to evaporation, CVD, sputtering, solution deposition, or spray pyrolysis, most preferably CVD. LED vertical interconnect 270 may comprise any suitable material which is conductive, including but not limited to ITO, AZO, FTO, or a conductive polymer such as Poly(3,4-ethylenedioxythiophene, or PEDOT), titanium, titanium nitride, tungsten, tantalum, tantalum nitride, copper, or aluminum. Portions of LED vertical interconnect 270 that are deposited on surface 262 of second dielectric layer 260 may be removed by any suitable technique, including but not limited to CMP, wet chemical etch, or plasma etch in corrosive gas, most preferably by CMP. In one embodiment, LED vertical interconnect 270 is cylinder-shaped, with the diameter of the cylinder in contact with LED contact 230, although any suitable shape may be used. In one example, the diameter of LED vertical interconnect 270 is 0.8 microns, although any suitable size may be used. LED vertical interconnect 270 forms a substantially ohmic contact to LED contact 230.

Figure 7D:
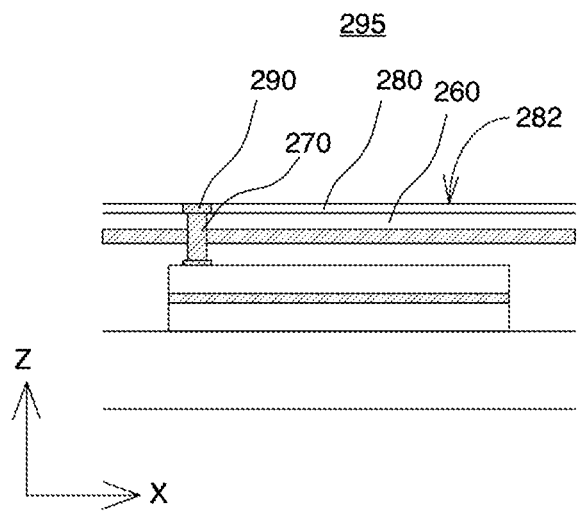

Turning to FIG. 7D, a third dielectric layer 280 is deposited on second dielectric layer 260. Third dielectric layer 280 may be any suitable material, such as silicon oxide, aluminum oxide, titanium oxide, silicon nitride, or combinations thereof, most preferably silicon oxide. Third dielectric layer 280 can be deposited by any suitable means, such as evaporation, sputtering, CVD, or spin-on techniques, most preferably by CVD. The thickness of third dielectric layer 280 may be between 0.05 and 10 microns. Next, a masking layer such as photoresist (not shown) is applied and patterned, and at least a portion of third dielectric layer 280 is removed by etching in specific locations, leaving a cavity. At least a portion of LED vertical interconnect 270 is exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer (not shown) is then removed. Conductive material is then deposited in the cavity created in third dielectric layer 280. After deposition, the conductive material on surface 282 of third dielectric layer 280 may be removed by any suitable technique, including but not limited to CMP, wet chemical etch, plasma etch in corrosive gas, most preferably by CMP, leaving a bond pad 290 comprising the conductive material in the cavity of third dielectric layer 280. The conductive material for bond pad 290 may be deposited by any suitable technique, including but not limited to evaporation, CVD, sputtering, solution deposition, electrodeposition, or spray pyrolysis. Bond pad 290 may comprise titanium, titanium nitride, tungsten, tantalum, tantalum nitride, copper, or aluminum, or combinations thereof. In one embodiment, bond pad 290 comprises layers of titanium, tantalum nitride, and copper. Bond pad 290 forms a substantially ohmic contact to LED vertical interconnect 270. Third dielectric layer 280 and bond pad 290 are known as a bond pad layer. Bond pad layers are used throughout this application, and will follow the same basic fabrication sequence described above. The fabrication of LED apparatus 295 as shown in FIG. 7D is now substantially complete.

III B. Control Circuit+Antifuse Apparatus Formation

Figure 8A:
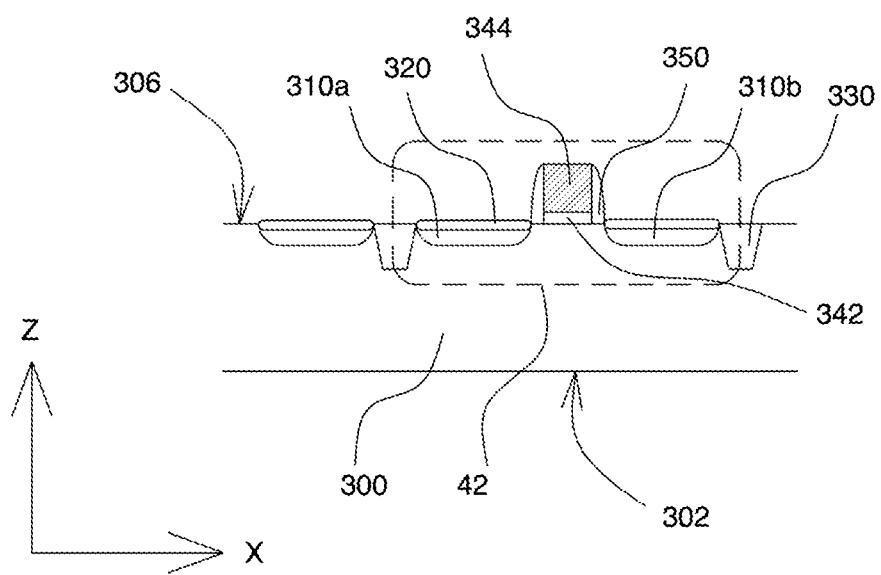
FIGS. 8A-D are cross-sectional schematics of a sequence of fabrication steps for a control circuit+antifuse apparatus in accordance with an embodiment of the invention.

Control circuit+antifuse apparatus formation is now described. It is to be understood that fabrication of many more control circuits and antifuses than is shown may be occurring simultaneously. In the following example, the control circuit will comprise two transistors and one capacitor. Transistor fabrication is first discussed. It is to be understood that any suitable transistor may be used, including but not limited to field effect transistors or bipolar transistors. The transistors may comprise any suitable material, including but not limited to single crystal, polycrystalline, or amorphous semiconductor. By using single crystal semiconductor for the channel of the transistor, a higher carrier mobility is obtained compared to thin film transistors which comprise amorphous or polycrystalline semiconductor. Turning to FIG. 8A, a transistor 42 is fabricated in transistor substrate 300. As transistor fabrication is well known to those skilled in the art, not all detailed steps will be discussed but instead are summarized. In this embodiment, transistor 42 comprises single crystal semiconductor. Although one transistor is shown to illustrate the process in detail in FIG. 8A, subsequent figures will show multiple transistors. Transistor substrate 300 may be any suitable single crystal semiconductor material, including but not limited to single crystal silicon, single crystal germanium, single crystal gallium arsenide, or single crystal gallium nitride, most preferably single crystal silicon. Transistor substrate 300 may comprise an etch-stop layer (not shown). The bottom surface 302 of the transistor substrate 300 is referred to as the initial bottom surface, because, in a later step, a portion of transistor substrate 300 including the initial bottom surface 302 will be removed, resulting in a different bottom surface. The etch-stop layer (not shown) may be any suitable material that has a substantially slower etch rate than transistor substrate 300. In one embodiment, the etch-stop layer may be silicon oxide, as provided by silicon-on-insulator (SOI) technology. In another embodiment, the etch-stop layer may be boron-doped silicon. A boron-doped silicon layer may be deposited as part of a thicker epitaxial layer deposition on a single crystal silicon wafer that comprises undoped silicon layers. The purpose of the etch-stop layer will be discussed later.

Conductive regions 310 are formed in top surface 306 of transistor substrate 300. One method to form conductive regions 310 is by doping a portion of transistor substrate 300 to be either p-type or n-type. It may be doped by any suitable technique, for example, by applying a masking layer (not shown), patterning, and then implanting ions. The masking layer is then removed. An anneal may activate the implanted ions. Conductive regions 310 are more conductive than the surrounding silicon substrate 300.

Conductive regions 310 may further comprise a silicide layer 320. Silicide layer 320 may be formed in conductive regions 310 to further decrease the resistance, form ohmic contacts, and/or form an etch-stop layer for subsequent steps. Silicide layer 320 is formed by deposition of a metal on transistor substrate 300. If transistor substrate 300 is silicon, the metal may include but not be limited to titanium, cobalt, nickel, or tungsten, and then annealing at elevated temperature (above 400° C.) to react the metal with silicon to form a silicide film, for example, titanium silicide, cobalt silicide, nickel silicide, or tungsten silicide. A wet etch (not shown) may remove unreacted metal from the apparatus. In other embodiments, a silicide layer is not a part of conductive regions 310.

In some embodiments, conductive regions 310 may be isolated from one another electrically by dielectric regions 330 formed in top surface 306 of transistor substrate 300. Dielectric regions 330 may be formed by shallow trench isolation (STI), field oxidation (FOX), or any other suitable dielectric region formation technique.

Transistor 42 comprises conductive regions 310a and 310b, which may be either a source or drain, a dielectric gate layer 342, a conductive gate layer 344, and a portion of transistor substrate 300 between conductive regions 310a and 310b which is the channel. Dielectric gate layer 342 may comprise silicon oxide, silicon nitride, aluminum oxide, hafnium silicon oxide nitride, hafnium silicon oxide, combinations therein, or any other suitable material. The thickness of dielectric gate layer 342 may be between 0.001 and 0.5 microns thick, for example about 0.02 microns. Conductive gate layer 344 may comprise any suitable material, including but not limited to conductive silicon, titanium nitride, tantalum, or tantalum nitride. Sidewall spacers 350 may exist on the sidewalls of conductive gate layer 344. Other elements of a single crystal transistor, such as lightly doped drains (LDD), are not described or shown herein but are well known to those skilled in the art and may be incorporated in other embodiments.

Figure 8B:
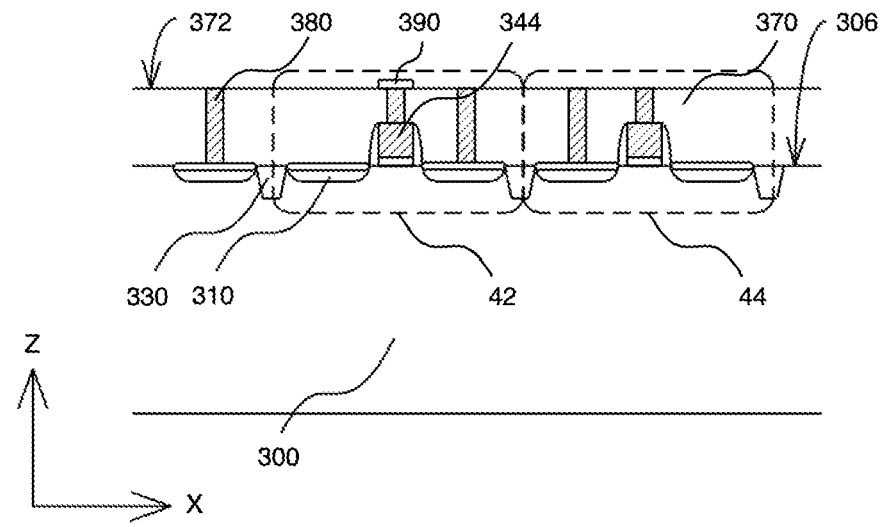

FIG. 8B shows two transistors 42 and 44. These two transistors 42 and 44 will be a portion of one 2T1C control circuit. Again, there may be many control circuits on transistor substrate 300, but only one is shown here. The materials and dimensions of these two transistors may be the same or different from one another. After transistor fabrication, fourth dielectric layer 370 is deposited on transistors 42 and 44, dielectric layers 330, and transistor substrate 300. Fourth dielectric layer 370 may be any suitable material, including but not limited to silicon oxide, silicon nitride, or aluminum oxide, most preferably silicon oxide. Fourth dielectric layer 370 is deposited by any suitable technique, including evaporation, sputtering, spin on, or CVD, most preferably CVD. Fourth dielectric layer 370 may be any suitable thickness, for example between 0.1 and 2 microns. In one embodiment the thickness is 0.2 microns. Top surface 372 of fourth dielectric layer 370 can be rendered substantially parallel to surface 306 of transistor substrate 300. Subsequent steps in fabrication will be described assuming that top surface 372 of fourth dielectric layer 370 shown in FIG. 8B has been planarized. It is to be understood that the fabrication could proceed without this planarizing step.

Transistor vertical interconnects are fabricated next. Transistor vertical interconnects 380 form ohmic contacts to some or all of conductive regions 310 and conductive gate layers 344. Transistor vertical interconnects 380 may be fabricated by any suitable technique. One example of transistor vertical interconnect fabrication is to deposit a masking layer (not shown), pattern the masking layer, and etch portions of fourth dielectric layer 370, exposing at least a portion of conductive regions 310 and conductive gate layers 344. The masking layer is then removed. Any suitable transistor vertical interconnect material, including but not limited to aluminum or tungsten, or a stack of titanium, titanium nitride, and aluminum, or a stack of titanium, titanium nitride, and tungsten, is deposited into the cavities where portions of fourth dielectric layer 370 were removed. The portions of transistor vertical interconnect material deposited on surface 372 are removed by any suitable technique such as etchback or CMP, leaving transistor vertical interconnects 380 in the cavities of fourth dielectric layer 370.

Antifuse formation is now described. Turning to FIG. 8B, antifuse dielectric layer 390, can be formed by depositing a dielectric layer on transistor vertical interconnects 380 and fourth dielectric layer 370. A masking layer (not shown) is deposited and patterned, and portions of the dielectric layer are etched, leaving antifuse dielectric layer 390 in contact with transistor vertical interconnect 380. Antifuse dielectric layer 390 may be any suitable material, including but not limited to silicon oxide, silicon nitride, aluminum oxide, hafnium oxide, tantalum oxide, or combinations therein. The thickness of dielectric antifuse layer 390 may be selected for an appropriate programming voltage. Thicker dielectric antifuse 390 layers will require more voltage to program than thinner layers for the same programming time is the same. In one example, a 3 nm-thick silicon oxide antifuse dielectric layer may be programmed by about a 10V voltage pulse with a programming duration of less than 10 micro seconds. In other embodiments, a programming voltage of 14 volts, 20 volts, or 30 volts or more is required to program the antifuse. A short programming time is desirable, as programming millions of antifuses would be prohibitively costly if the programming time is too long. As stated previously, in general, it is desirable to select the programming voltage of the antifuse to be higher than the standard operating voltage of the control circuit. In this manner, unprogrammed antifuses will not be programming during standard operation of the pixels to display images.

Figure 8C:
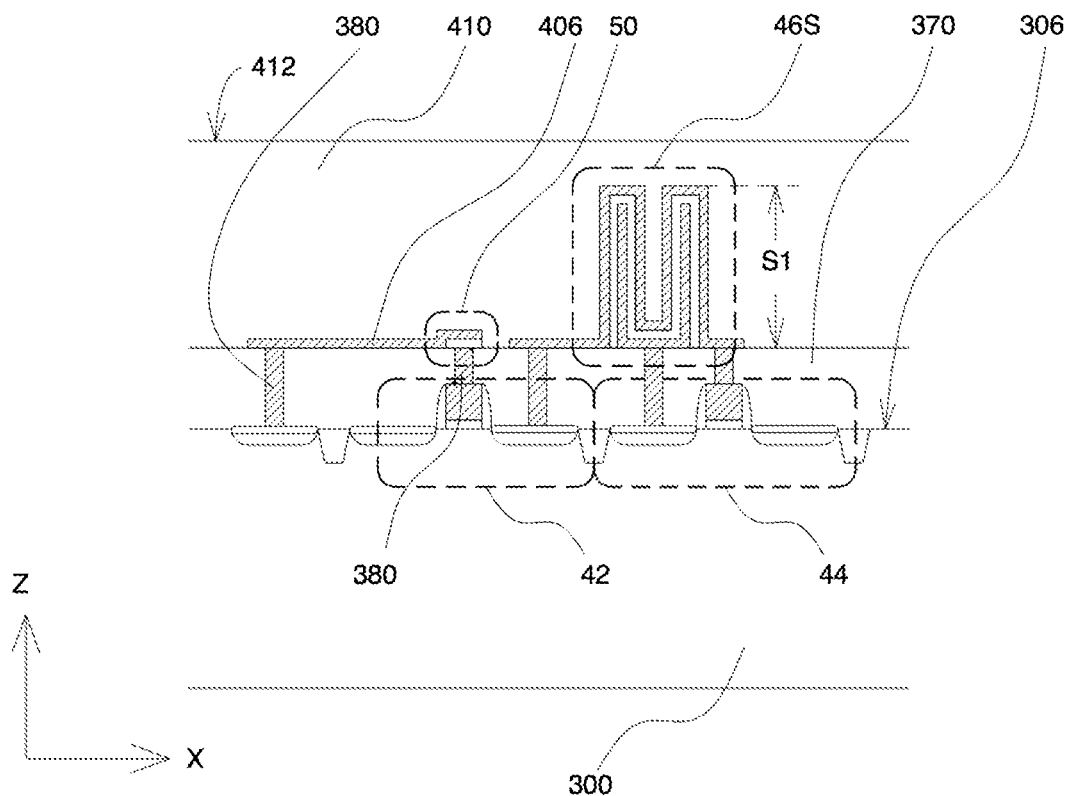

Turning to FIG. 8C, a horizontal interconnect layer 406 is deposited on antifuse dielectric layer 390. Horizontal interconnect layer 406 may formed by depositing a continuous layer, masking (not shown), and etching, to form the structure shown in FIG. 8C. Horizontal interconnect layer 406 may comprise a metal, such as titanium, titanium nitride, tungsten, aluminium, or a doped semiconductor such as silicon. Horizontal interconnect layer 406, antifuse dielectric layer 390, and transistor vertical interconnect 380 together form antifuse 50. Horizontal interconnect 406 is also connected to transistor vertical interconnect 380. When antifuse 50 is programmed, antifuse dielectric layer 390 is ruptured, and horizontal interconnect 406 and transistor vertical interconnect 380 are shorted together at the point of rupture. Horizontal interconnect layer 406 and transistor vertical interconnect 380 are both conductive layers, so antifuse 50 comprises first and second conductive layers with antifuse dielectric layer 390 disposed between and in contact with the first and second conductive layers. There are also suitable antifuse constructions other than conductive layer-dielectric layer-conductive layer. For example, an amorphous silicon layer with metal layers on either side may be used as an antifuse. The amorphous silicon has a high resistivity in the unprogrammed state. A voltage pulse in this structure creates a conductive path connecting the two metal layers. Any suitable antifuse may be used.

Formation of the capacitor device of the control circuit is next described. As shown in FIG. 8C, stack capacitor 46S has a longest dimension S1 in the Z coordinate, substantially orthogonal to the top surface 306 of transistor substrate 300. Any suitable capacitor form may used, including but not limited to stack capacitors, trench capacitors, and planar capacitors. Stack capacitor 400S comprises two conductive electrode layers separated by a dielectric layer or layers. Other devices in the control circuit are coupled to the electrodes of stack capacitor 400S. Some portions of the electrode layers which were used to form stack capacitor 400S may be used to form horizontal interconnects between devices in a control circuit, such as horizontal interconnect 406.

A fifth dielectric layer 410 is deposited on fourth dielectric layer 370 and stack capacitor 400S. Fifth dielectric layer 410 may be any suitable material, for example silicon oxide, and may be deposited by any suitable technique, including evaporation, sputtering, spin on, or CVD, most preferably CVD, and may be any suitable thickness, for example 2 microns. Fifth dielectric layer 410 may be any suitable thickness, for example between 0.1 and 5 microns. In one embodiment the thickness is 2 microns. Top surface 412 of fifth dielectric layer 410 can be rendered substantially parallel to top surface 306 of transistor substrate 300. Subsequent steps in fabrication will be described assuming that surface 412 of fifth dielectric layer 410 shown in FIG. 8C has been planarized. It is to be understood that the fabrication could proceed without this planarizing step.

Figure 8D:
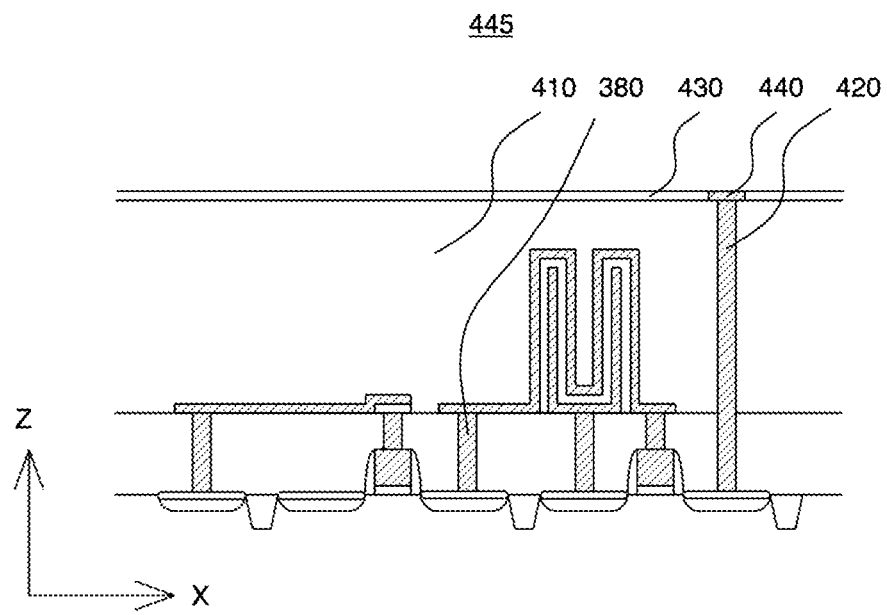

Turning to FIG. 8D, transistor vertical interconnect 420 is formed in fifth dielectric layer 420 and fourth dielectric layer 370 by techniques similar to those described earlier for transistor vertical interconnects 380. A bond pad layer comprising a sixth dielectric layer 430 and a bond pad 440 is then formed on fourth dielectric layer 410. Bond pad layer formation has been previously described. Control circuit+antifuse apparatus 445 is now substantially complete.

III C. Bonding the Control Circuit+Antifuse Apparatus to the LED Apparatus

Figure 9:
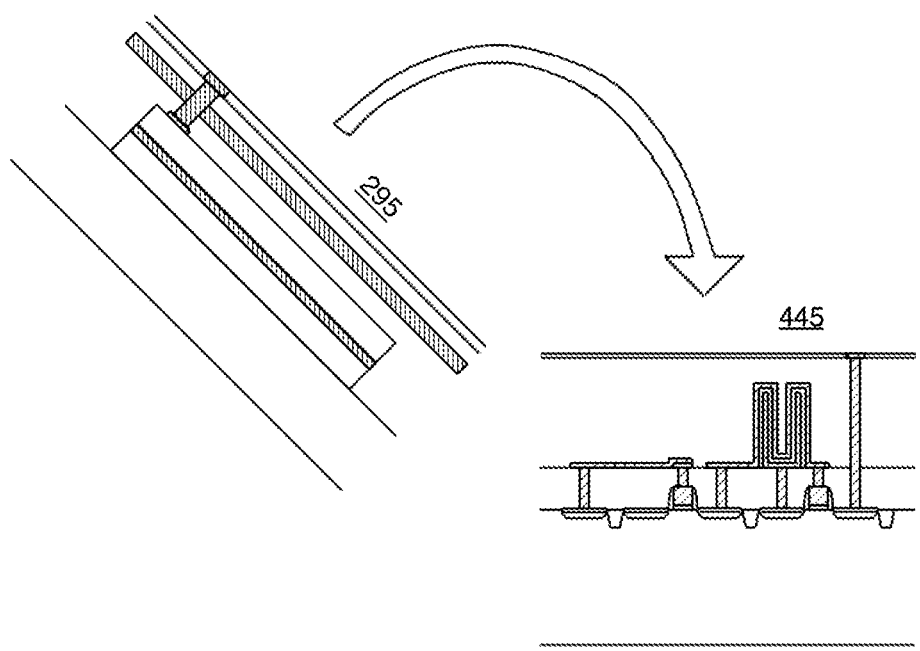
FIG. 9 is a cross-sectional schematic showing the flipping of the LED apparatus and bonding to the control circuit+antifuse apparatus in accordance with an embodiment of the invention.
Figure 10A:
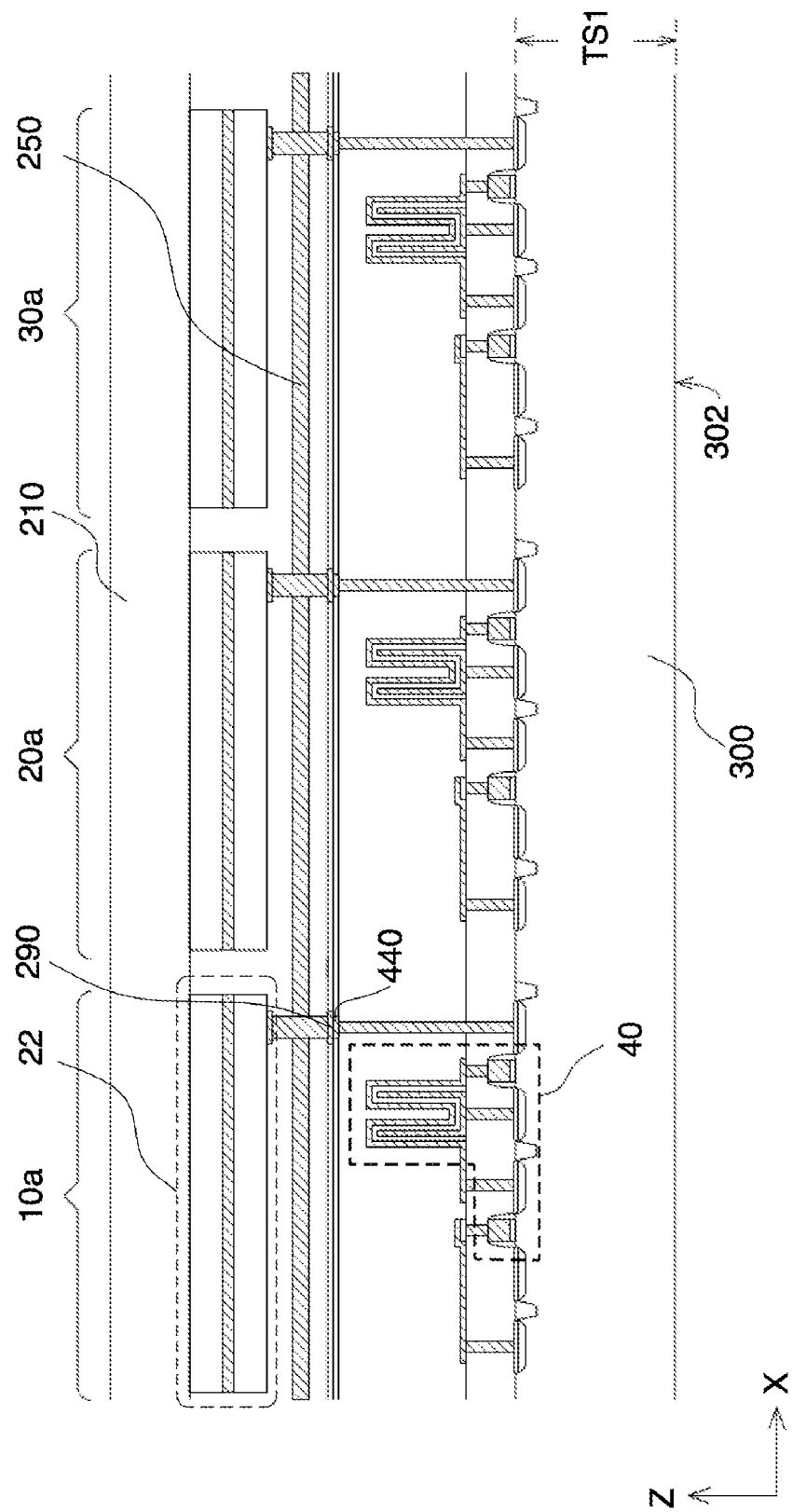
FIGS. 10A-F are cross-sectional schematics of a sequence of fabrication steps for a pixel in accordance with an embodiment of the invention.

Turning to FIG. 9, LED apparatus 295 is flipped over and bonded to control circuit+antifuse apparatus 445. The two bonded apparatus are shown in FIG. 10A in cross-section. The devices on each respective substrate face one another, with transistor substrate 300 and LED substrate 210 being the outermost surfaces of the bonded pair at this stage in fabrication. Any suitable bonding technique may be used, including but not limited to hybrid bonding, thermocompression bonding, anodic bonding, plasma activated bonding, eutectic bonding, or surface activated bonding. The bond formed between two structures may be: wafer-to-wafer, in which two wafers each with multiple die are bonded to one another; die-to-wafer, in which a die or dice are bonded to a wafer; or die-to-die, in which a die is bonded to another die. A wafer usually comprises multiple die. Hybrid wafer bonding or hybrid die bonding describes the joining of two surfaces, wherein at least one of the two surfaces comprises at least two different materials. In one example of hybrid bonding, the two surfaces are brought into contact under pressure and heated to achieve a bond of the two surfaces. In this embodiment, hybrid bonding is used. Electrical connections between the two apparatus are made at the points of contact between bond pads on the respective surfaces.

It is to be appreciated that LED apparatus 295 is not connected to control circuit+antifuse apparatus 445 through wire bonds, which are common in the prior art. Wire bonds are interconnects that join two devices by a wire that is mechanically placed and bonded to the two devices using downward pressure and ultrasonic energy and/or heat. The wires in wire bonds are typically 15 microns in diameter or larger and have metal balls at either end that are larger than 15 microns in diameter. The dimensions of wire bonds are unsuitable for joining the transistors and LEDs in these embodiments.

FIG. 10A shows a cross-section with 3 sets of devices that are partially fabricated group subpixels 10a, 20a, and 30a. These 3 sets of devices have been bonded together in the same manner shown as the single set of devices in FIG. 9. Subpixel 10a is described in detail, and it is to be understood that subpixels 20a and 30a are similar to subpixel 10a at this point in fabrication. After bonding, the two apparatus are coupled through the bond pads 440 and 290. LED 22 of subpixel 10a is coupled with control circuit 40. Reflector layer 250 is disposed between LED 22 and transistor substrate 300.

III D. Through Substrate Interconnects

Until this point in the fabrication sequence, both LED substrate 210 and transistor substrate 300 have remained fully intact, as shown in FIG. 10A. Both LED substrate 210 and transistor substrate 300 may each be between 200 and 700 microns thick, although they may be any suitable thickness that allows for mechanical handling during fabrication. This thickness imparts mechanical stability to the respective substrates and allows the devices to be handled during fabrication. With two thick substrates bonded together, one of the two substrates can now be removed in whole or in part, and the structure will retain mechanical stability for handling with one substrate intact.

Figure 10B:
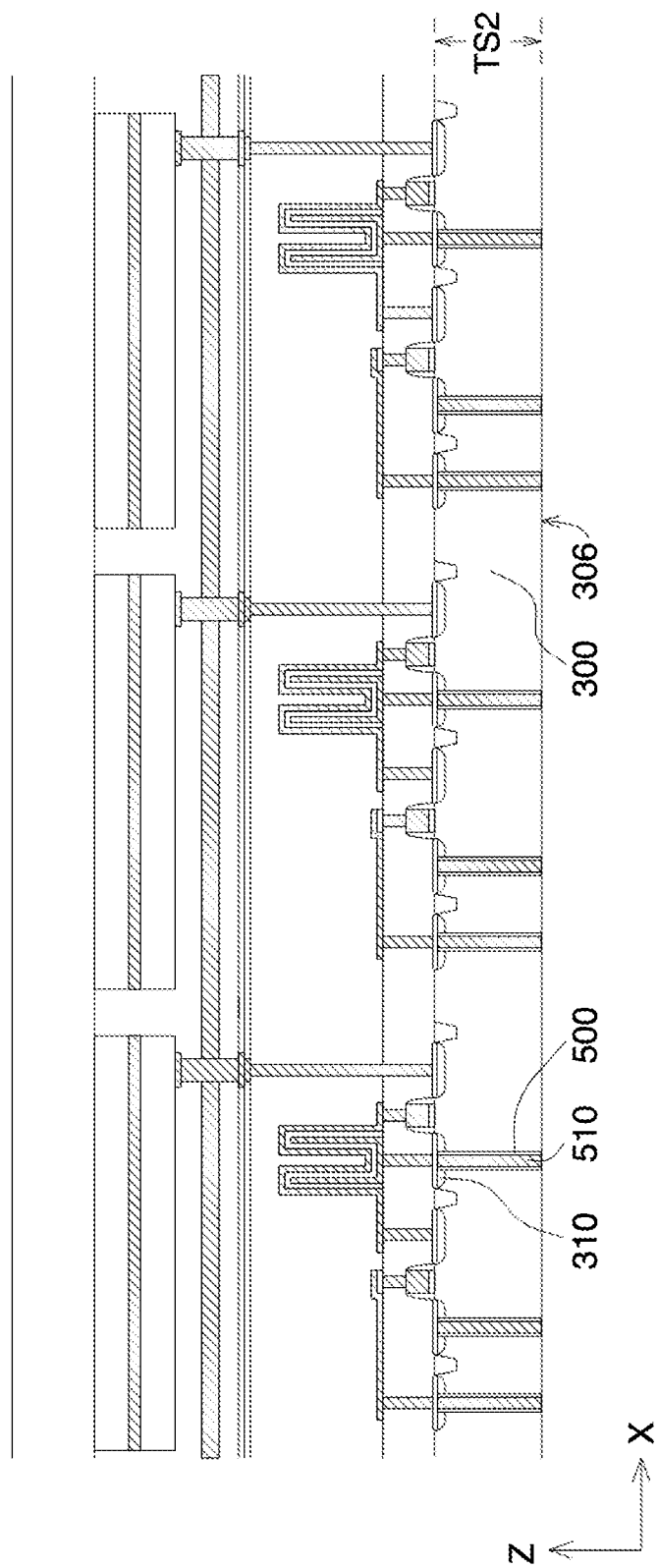

Turning to FIG. 10B, a portion of transistor substrate 300 is now removed. Transistor substrate 300 in FIG. 10A has an original thickness TS1. A portion of transistor substrate 300 can be removed by any suitable wafer thinning technique, including but not limited to laser ablation, mechanical polishing, or chemical etch. In one embodiment, mechanical polishing may be combined with chemical etch to remove a thickness of the transistor substrate 300, with resultant transistor substrate thickness TS2 shown in FIG. 10B. Thickness TS2 is substantially less than thickness TS1. Due to the scale of FIGS. 10A and 10B, the thickness of transistor substrate 300 removed is not accurately shown. By combining mechanical polishing with chemical etching, a more precise thickness of transistor substrate 300 may be removed at lower cost and with greater precision in the remaining substrate thickness than if either technique was used alone. For example, mechanical polishing may first remove about 400 microns of an initial 500 micron-thick dimension TS1 of transistor substrate 300, resulting in a post-polish transistor substrate thickness of about 100 microns. For wafer thinning by polishing, the wafer is rotated about its center on a surface with abrasive media. Wafer thinning by mechanical force is sometimes referred to as grinding when the remaining substrate surface is rough, and polishing when the remaining substrate surface is smooth. Either grinding or polishing, or a combination, may be used. After grinding and/or polishing, a chemical etch may then remove about 95 microns of the remaining 100 microns, leaving 5 microns (dimension TS2) of transistor substrate 300. Chemical etch of transistor substrate 300 may be accomplished by any suitable chemistry. For example, KOH, TMAH, HF+HNO$_3$, or HF+NH$_4$F chemistries may be used to etch silicon substrates. An etch-stop layer in transistor substrate 300 (not shown) may act to slow or stop the rate of substrate grinding, polishing, or etching so that the remaining thickness TS2 of transistor substrate 300 may be reliably determined. For example, if KOH is used to etch silicon, KOH will etch undoped silicon about 20× faster than a heavily boron-doped silicon etch-stop layer. The boron-doped layer of silicon acts as an efficient etch-stop for silicon etching. If silicon oxide is used as the etch-stop layer, KOH will etch silicon about 500× faster than it will etch silicon oxide. The silicon oxide layer acts as an efficient etch-stop for silicon etching. Initial bottom surface 302 of transistor substrate 300 is removed.

Referring to FIG. 10B, after removal of a portion of transistor substrate 300, the remaining portion of transistor substrate 300 designated by dimension TS2 remains and has a bottom surface 306. The final thickness TS2 of transistor substrate 300 may be any suitable dimension from 0.1 to 100 microns, most preferably less than 20 microns. Reducing the value of TS2 to less than 20 microns facilitates formation of through substrate interconnects with small size.

By removing most of the original transistor substrate 300, through substrate interconnects with small features can now be fabricated in the remaining transistor substrate 300. Through substrate interconnects 510 are fabricated by first masking and etching cavities in transistor substrate 300. The cavities in transistor substrate 300 expose a portion of conductive regions 310. Portions of transistor substrate 300 may be etched by any suitable etchant, including corrosive gases or chemical acids, most preferably by corrosive gases. The masking layer (not shown) is then removed. In one embodiment, after etching, a sidewall dielectric layer 500 may be formed on the sidewalls of the cavities in transistor substrate 300. Sidewall dielectric layer 500 will insulate the sidewalls of the transistor substrate 300 from the subsequently formed through substrate interconnects 510. Sidewall dielectric layer 500 may comprise any suitable material, including but not limited to silicon oxide or silicon nitride, most preferably silicon oxide. Sidewall dielectric layer 500 may be deposited by any technique with good step coverage, most preferably by CVD. Portions of sidewall dielectric layer 500 that are deposited on conductive regions 310 can be removed by an anisotropic etch. This anisotropic etch will remove portions of sidewall dielectric layer 500 that are on the surface of conductive region 310 while leaving a portion on the sidewalls of transistor substrate 300. This process allows the through substrate interconnect that follows to make electrical contact to the conductive regions 310 while being insulated from transistor substrate 300. The remaining portions of sidewall dielectric layer 500 are shown in FIG. 10B. In other embodiments, a sidewall dielectric layer is not needed on the sidewalls of the cavities in transistor substrate 300, for example when transistor substrate 300 is not substantially conductive.

Through substrate interconnect material is deposited in the cavities of transistor substrate 300. The through substrate interconnect material may comprise any suitable material, including but not limited to aluminum, copper, or tungsten, or a stack of titanium, titanium nitride, and aluminum layers, or a stack of titanium, titanium nitride, and tungsten layers, or a stack of titanium, tantalum nitride, and copper layers. Any suitable method for through substrate interconnect deposition may be used, such as evaporation, sputtering, electrodeposition, or CVD. Through substrate interconnect material on surface 306 of transistor substrate 300 can be removed by etching or CMP, most preferably by CMP, leaving through substrate interconnects 510. Through substrate interconnects 510 are electrically connected to conductive regions 310.

Figure 10C:
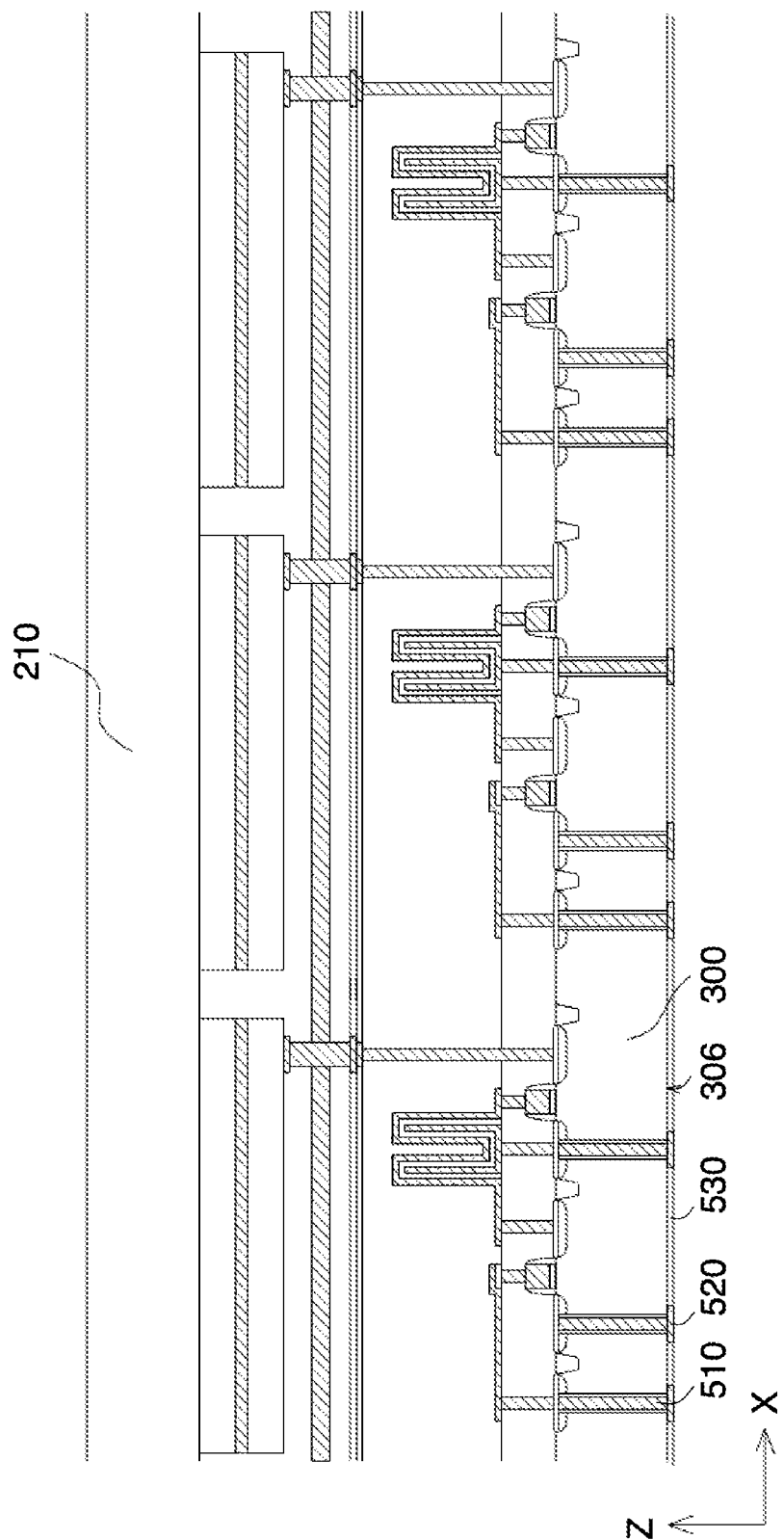

Turning to FIG. 10C, a bond pad layer is formed on surface 306 of transistor substrate 300, resulting in bond pads 520 in seventh dielectric layer 530. Bond pads 520 are electrically connected to through substrate interconnects 510. LED substrate 210 remains on the apparatus at this point in fabrication to allow for mechanical handling of the bonded apparatus.

III E. Bonding the Paired LED and Control Circuit+Antifuse Apparatus to a Backboard Turning to FIG. 10D, the LED apparatus and control circuit+antifuse apparatus pair is bonded to the backboard 540. Backboard 540 comprises a backboard substrate 550 with a plurality of bond pads 560 and a plurality of backboard interconnects. The backboard interconnects may comprise data lines 60, select lines 70, and power lines 72. Backboard 540 may comprise a printed circuit board (PCB) or an interposer. An interposer may comprise a silicon oxide or silicon substrate, and will have a smooth top surface 562 compared with the rougher top surface of a PCB. The surface roughness of surface 562 will be less than 0.2 microns root mean square for an interposer. The surface roughness of a PCB made of, for example, FR-4, may exceed 5 microns root mean square. The small surface roughness of an interposer allows the patterning by lithography of fine features less than 0.5 micron in size, such as the plurality of backboard interconnects. In one embodiment, backboard 540 may comprise an interposer, and backboard interconnects may be fabricated by a damascene process in silicon oxide. Backboard interconnects may comprise copper or any suitable conductive material. In other embodiments, backboard interconnects may be fabricated as multiple layers separated by dielectric layers and connected by vertical interconnects (not shown). In a different embodiment, backboard 540 may comprise a printed circuit board (PCB) with the backboard substrate 550 comprising FR-4 material and backboard interconnects comprising copper. An interposer can generally provide smaller feature sizes and pitches of backboard interconnects compared with a PCB, and an interposer is preferred for this reason. The interposer or PCB may comprise additional aspects (not shown), such as adhesive metal layers, micro bump connections, ball or stud bumps, or copper paste, or any suitable feature.

After bonding, data lines 70 and power lines 72 are electrically connected to control circuit 40. In this embodiment, antifuse 50 electrically isolates control circuit 40 from select line 60 at this stage of fabrication, as they antifuse has not yet been programmed. Any suitable bonding technique may be used to join the backboard 540 to control circuit 40, including but not limited to thermocompression bonding, adhesive bonding, anodic bonding, plasma activated bonding, eutectic bonding, or surface activated bonding, most preferably thermocompression bonding. Other techniques may be used to bond backboard 540 to the control circuit+antifuse apparatus that comprises control circuit 40, including but not limited to ball or stud bumping and copper pasting. The principles and mechanisms of these types of bonding techniques are well known to those skilled in the art.

At this point in fabrication, subpixels 10$a$, 20$a$, and 30$a$ are coupled to data circuits (not shown) through data lines 70. Photoluminescent testing and programming of some antifuses of the display may be accomplished at this point, prior to addition of wavelength-converting layers (described below). In this manner, only the LEDs will be induced to emit light.

III F. Formation of Wavelength-Converting Layer

Figure 10D:
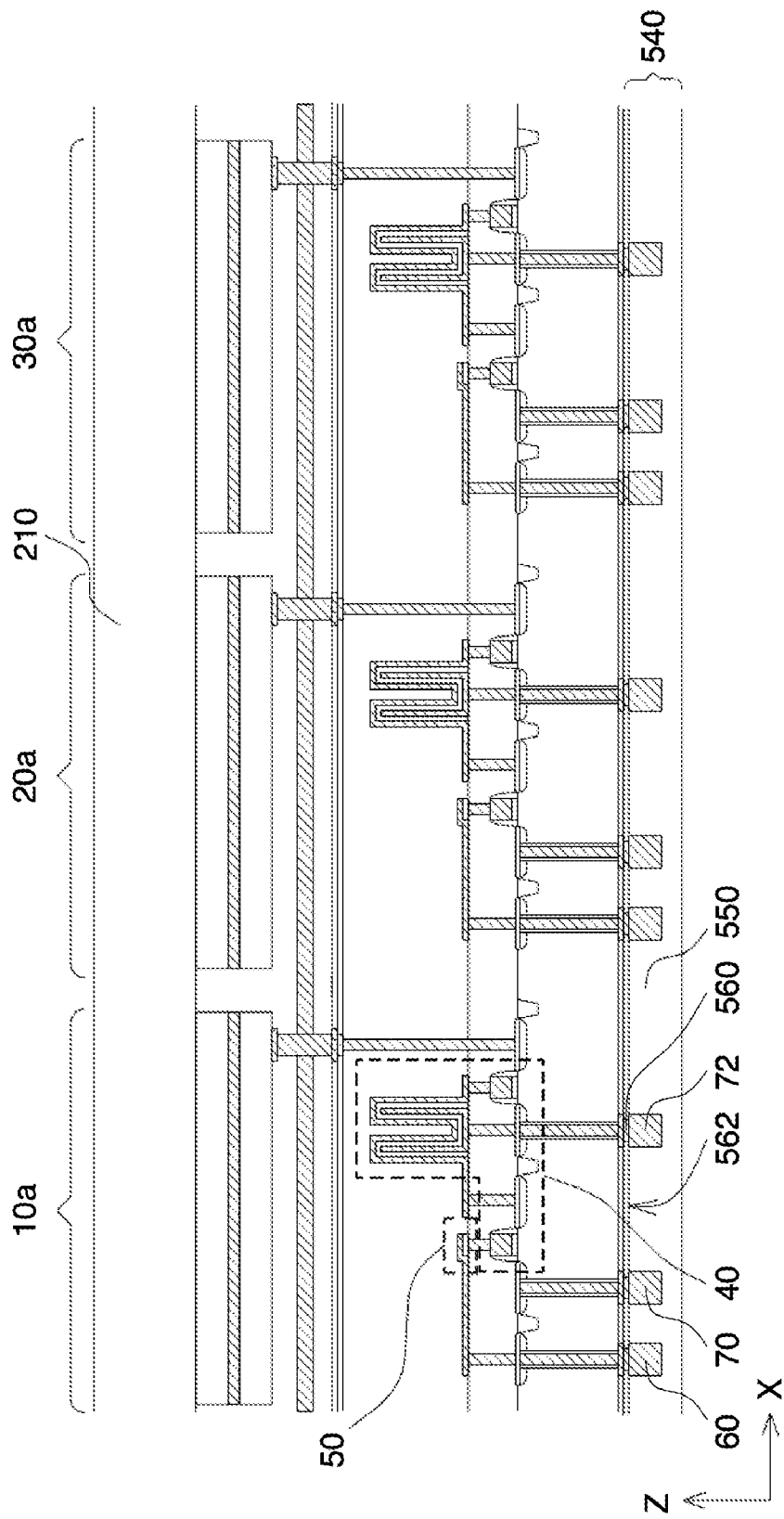
Figure 10E:
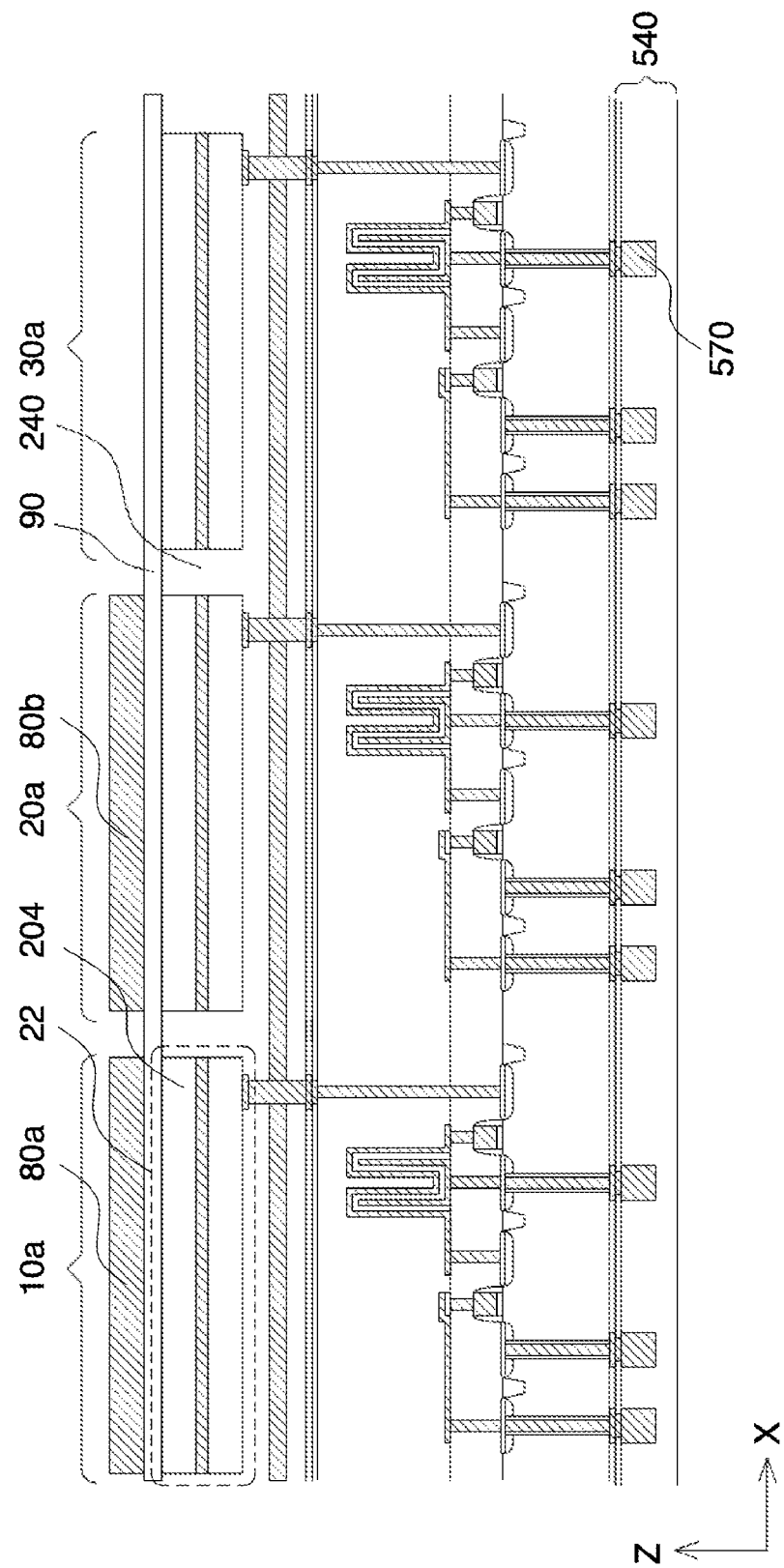

Turning to FIG. 10E, backboard 540 can provide sufficient mechanical stability to the structure such that LED substrate 210 shown in FIG. 10D can now be removed. LED substrate 210 may be removed by a laser process. If LED substrate 210 is sapphire, a KrF Excimer laser with an energy density of 400 mJ/cm$^2$, a wavelength of 248 nm, and a pulse width of 38 ns can irradiate the sapphire surface at an elevated temperature of 60° C. and remove the sapphire substrate from LED 200. LED substrate 210 may be removed by chemical etching. If LED substrate 210 is GaAs, a solution of $NH_4OH:35H_2O$ or a solution of $5H3PO4:3H_2O_2:3H_2O$ can be applied to remove the GaAs substrate from the LEDs 200. If LED substrate 210 is silicon, a solution of KOH, TMAH, $HF+HNO_3$, or $HF+NH_4F$ can be applied to remove LED substrate 210.

After LED substrate 210 is removed, a transparent conductive layer 90 is deposited on LEDs 22 and first dielectric layer 240. Transparent conductive layer 90 may be any suitable material that is substantially transparent to visible light and is relatively conductive to electricity, including but not limited to indium tin oxide (ITO), aluminum zinc oxide (AZO), fluorine-doped tin oxide (FTO), or a stack of a thin nickel layer followed by a thin gold layer. Transparent conductive layer 90 may be deposited by any suitable technique, such as evaporation, CVD, or sputtering, most preferably evaporation. An interconnect (not shown), may connect transparent conductive layer 90 to a backboard interconnect. Transparent conductive layer 90 may be patterned and etched (not shown). Transparent conductive layer 90 couples to first conductive layer 204 of LED 22. Transparent conductive layer 90 can be coupled to a ground circuit (not shown).

Wavelength-converting layer 80a is deposited on transparent conductive layer 90. Wavelength-converting layer 80a overlies LED 22. In other embodiments (not shown) a dielectric layer may be disposed between transparent conductive layer 90 and wavelength-converting layer 80a. Wavelength-converting layer 80a is excited by the light emitted by LED 22 and emits light of a different wavelength than is emitted by LED 22. In a specific embodiment, wavelength-converting layer 80a may comprise an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In a different embodiment, silicone, epoxy, or polycarbonate may be combined with quantum dots, the quantum dots being nano-scale semiconductor material, for example group II-VI material having a composition ZnCdMgSe, CdSe, InP, or ZnS. In one embodiment, the composition of the quantum dots can be optimized to emit red (500 to 550 nm) or green (610 to 730 nm) light when excited by blue light (420 to 470 nm). Any suitable quantum dot composition may be used. In one embodiment, wavelength-converting layer 80a may be screen printed into any suitable pattern.

In a different embodiment, wavelength-converting layer 80a may be phosphor particles or quantum dots embedded in glass, a technique known as phosphor-in-glass (PiG) or quantum dot-in-glass (QDiG). For example, glass paste combining $SiO_2$, $B_2O_3$, phosphor particles or quantum dots, adhesive, and organic solvent may be screen printed onto transparent conductive layer 580. The screen printing may be done with a stencil pattern or without patterning. Volatile organic components of the glass paste may be removed by drying at 150° C. and sintering at 600° C. In a different embodiment, the PiG or QDiG layer may be deposited by a spin-on technique, in which chemicals and phosphor particles or quantum dots are suspended in organic solvents. The solution is spun onto transparent conductive layer 90 as a film. The film is dried and annealed, which substantially removes the organic materials, leaving a glass film with phosphor particles or quantum dots. The glass film with phosphor particles or quantum dots is wavelength-converting layer 80a. If the wavelength-converting layer 80a was not initially patterned during deposition, a masking layer (not shown) can be applied, patterned, and wavelength-converting layer 80a etched to form a pattern. Wavelength-converting layer 80a may be etched by any suitable etchant, including but not limited to acids or corrosive gases. The masking layer is removed.

In yet another embodiment, wavelength-converting layer 80a may comprise multiple quantum wells (MQWs). Quantum wells are two dimensional films of inorganic semiconductors, and comprise pairs of alternating films of different materials, for example, ZnCdSe/ZnSe, ZnCdSe/ZnCdMgSe, InGaN/GaN, AlGaNInP/GaNInP, or any suitable pairing. In one example, GaInN/GaN MQW films in wavelength-converting layer 590a absorb light with a dominant wavelength from 420 to 470 nm (blue) from LED 200 and emit light with a dominant wavelength of 610 to 730 nm (green). In another example, AlGaNInP/GaNInP MQW films in wavelength-converting layer 80a absorb light with a dominant wavelength from 420 to 470 nm (blue) from LED 200a and emit light with a dominant wavelength of 500 to 550 nm (red).

Wavelength converting layer 80b is then fabricated. It may be advantageous for wavelength converting layers 80a and 80b to be emit different dominant wavelengths of light. For example, wavelength converting layer 80a may emit red light and wavelength-converting layer 80b may emit green light. In one embodiment, the LEDs underlying wavelength converting layers 80a and 80b emit light of the about same dominant wavelength. In other embodiments, the LEDs may emit light of different dominant wavelengths. In other embodiments (not shown), wavelength-converting layers 80a and 80b may be separated by intervening dielectric layers.

Figure 10F:
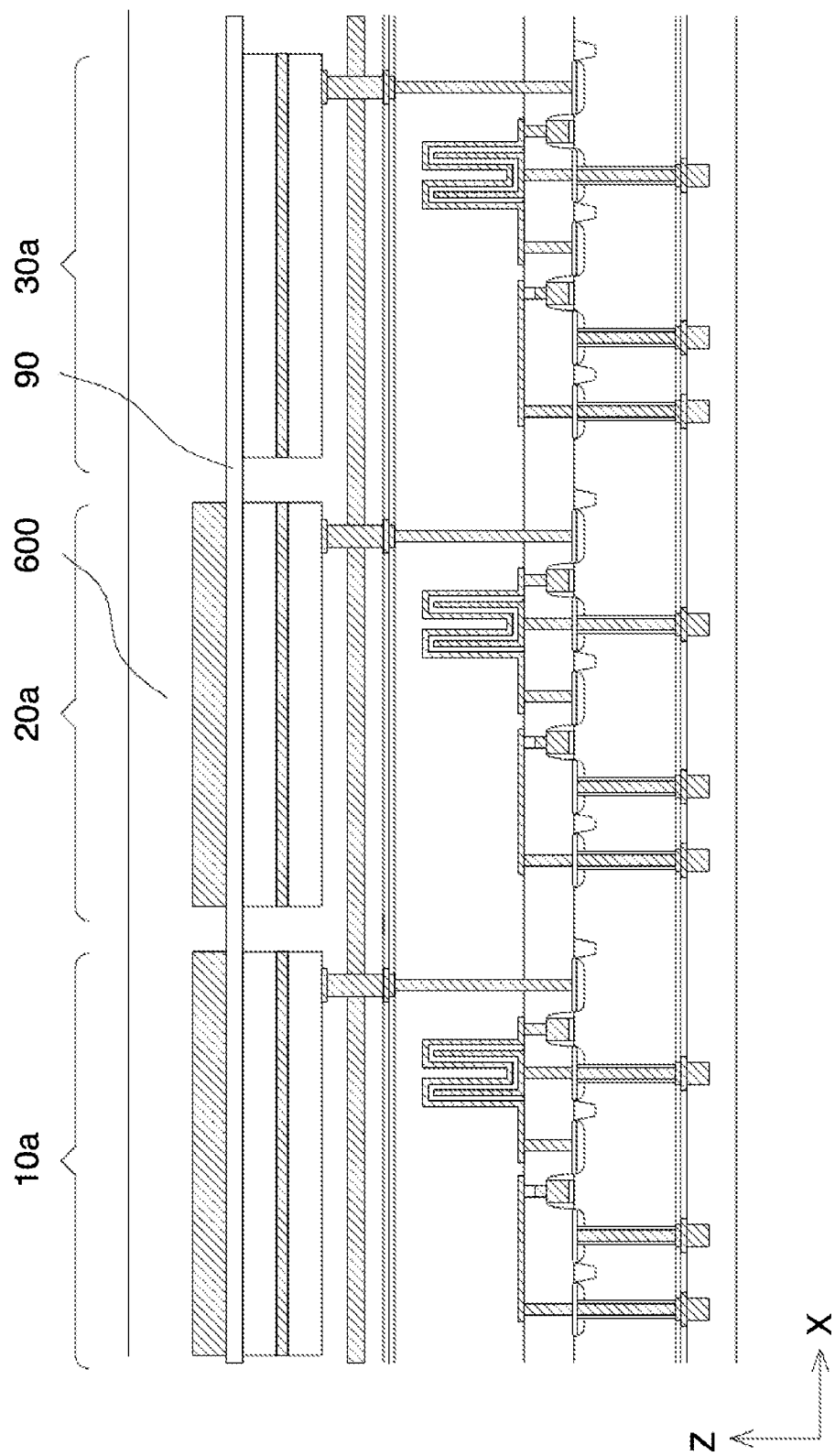

Turning to FIG. 10F, a passivating layer 600 is deposited on wavelength-converting layers and transparent conductive layer 90. Passivating layer 600 may comprise a transparent dielectric layer such as silicon oxide or silicone, and serves as a barrier to mobile ion intrusion into the devices underneath. Fabrication of subpixels 10a, 20a, and 30a is now substantially complete. As other subpixels (not shown) can be fabricated simultaneously, pixel or display fabrication would also be substantially complete. For example, fabrication of subpixels 10b, 20b, and 30b shown in FIG. 1A would be completed simultaneously with subpixels 10a, 20a, and 30a, together forming pixel 6.

Summarizing, a method to make a pixel has the steps of providing a backboard, the backboard having a plurality of data circuits and select circuits. A plurality of control circuits and antifuses are formed on a transistor substrate, with each antifuse is coupled to a control circuit. A plurality of LEDs is formed on an LED substrate. The LEDs are bonded to the control circuits and the LEDs and control circuits are coupled after bonding. The control circuits are then bonded to the backboard. After this bonding, an antifuse is disposed between each control circuit and either a data circuit or a select circuit.

What is claimed is:

1. A display panel comprising:
a plurality of data circuits;
a plurality of select circuits; and
a plurality of subpixels arranged in a two dimensional array, wherein each subpixel comprises
an LED,
a control circuit that is coupled to the LED, and
an antifuse disposed between the control circuit and a data circuit.

2. The display panel of claim 1 wherein each control circuit of the plurality of subpixels comprises at least one transistor, wherein the at least one transistor comprises single crystal semiconductor.

3. The display panel of claim 1 wherein the antifuse comprises a first conductive layer, a second conductive layer, and an antifuse dielectric layer disposed between and in contact with the first and second conductive layers.

4. The display panel of claim 1 wherein at least one subpixel of the plurality further comprises a wavelength-converting layer.

5. The display panel of claim 1 wherein the largest dimension of at least one of the LEDs is less than 20 microns.

6. The display panel of claim 1 where each LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

7. A display panel comprising:
a plurality of data circuits;
a plurality of select circuits; and
a plurality of subpixels arranged in a two dimensional array, wherein each subpixel comprises
an LED,
a control circuit that is coupled to the LED, and
an antifuse disposed between the control circuit and a select circuit of the plurality.

8. The display panel of claim 7 wherein each control circuit of the plurality of subpixels comprises at least one transistor, wherein the at least one transistor comprises single crystal semiconductor.

9. The display panel of claim 7 wherein each LED overlies the control circuit.

10. The display panel of claim 7 wherein at least one subpixel of the plurality further comprises a wavelength-converting layer.

11. The display panel of claim 7 wherein the largest dimension of at least one of the LEDs is less than 20 microns.

12. The display panel of claim 7 where each LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

* * * * *